United States Patent
Alston et al.

(10) Patent No.: US 10,262,950 B1
(45) Date of Patent: Apr. 16, 2019

(54) VISIBLE ALIGNMENT MARKERS/LANDMARKS FOR CAD-TO-SILICON BACKSIDE IMAGE ALIGNMENT

(71) Applicant: QUALCOMM Incorporated, San Diego, CA (US)

(72) Inventors: Michael Duane Alston, San Diego, CA (US); Hadi Bunnalim, San Diego, CA (US); Lesly Zaren Venturina Endrinal, San Diego, CA (US); Mickael Sebastien Alain Malabry, San Diego, CA (US); Lavakumar Ranganathan, San Diego, CA (US); Rami Fathy Amin Gomaa Salem, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/913,784

(22) Filed: Mar. 6, 2018

Related U.S. Application Data

(60) Provisional application No. 62/573,556, filed on Oct. 17, 2017.

(51) Int. Cl.
 *H01L 27/118* (2006.01)
 *H01L 23/544* (2006.01)
 (Continued)

(52) U.S. Cl.
 CPC ........ *H01L 23/544* (2013.01); *H01L 21/2253* (2013.01); *H01L 21/28185* (2013.01);
 (Continued)

(58) Field of Classification Search
 CPC ............... H01L 23/544; H01L 21/2253; H01L 21/28185; H01L 21/28194
 See application file for complete search history.

(56) References Cited

U.S. PATENT DOCUMENTS

| | | |
|---|---|---|
| 7,009,247 B2 | 3/2006 | Darwish |
| 7,736,916 B2 | 6/2010 | Aghababazadeh et al. |

(Continued)

OTHER PUBLICATIONS

International Search Report and Written Opinion—PCT/US2018/048371—ISA/EPO—dated Nov. 29, 2018.

*Primary Examiner* — Selim U Ahmed
*Assistant Examiner* — Andre C Stevenson
(74) *Attorney, Agent, or Firm* — Arent Fox, LLP

(57) ABSTRACT

A metal oxide semiconductor (MOS) integrated circuit (IC) has a plurality of fiducial standard cells of different cell sizes. The different cell sizes are non-equally utilized. The plurality of fiducial standard cells are placed to have a random offset from a uniform global placement pattern. Each of the fiducial standard cells has at least four power rails and various sets of active regions. The power rails extend in a first direction. The active regions are provided adjacent to the power rails but are disconnected from contacts and interconnects and thus do not draw power from the power rails. Instead, the active regions are disjoint and collinear thereby creating islands of active regions among spacings of inactive regions. These inactive regions more easily allow electromagnetic radiation to pass through thereby allowing the MOS fiducial standard cell to be visible for a CAD-to-silicon backside image alignment even with 7 nm feature sizes.

20 Claims, 20 Drawing Sheets

(51) Int. Cl.
*H01L 29/10* (2006.01)
*H01L 29/49* (2006.01)
*H01L 29/423* (2006.01)
*H01L 29/51* (2006.01)
*H01L 29/66* (2006.01)
*H01L 21/66* (2006.01)
*H01L 29/78* (2006.01)
*H01L 21/225* (2006.01)
*H01L 21/28* (2006.01)
*H01L 21/8234* (2006.01)

(52) U.S. Cl.
CPC .............. *H01L 21/28194* (2013.01); *H01L 21/823487* (2013.01); *H01L 22/20* (2013.01); *H01L 29/1095* (2013.01); *H01L 29/42368* (2013.01); *H01L 29/4983* (2013.01); *H01L 29/512* (2013.01); *H01L 29/66621* (2013.01); *H01L 29/7813* (2013.01); *H01L 29/7834* (2013.01)

(56) References Cited

U.S. PATENT DOCUMENTS

| | | |
|---|---|---|
| 8,420,410 B2 | 4/2013 | Laisne et al. |
| 9,502,351 B1 | 11/2016 | Sahu et al. |
| 2014/0145342 A1 | 5/2014 | Schultz et al. |
| 2014/0149811 A1 | 5/2014 | Ross et al. |
| 2016/0283631 A1 | 9/2016 | Lin et al. |
| 2017/0178981 A1* | 6/2017 | Lam ................ H01L 27/11807 |
| 2018/0074117 A1 | 3/2018 | Salem et al. |

* cited by examiner

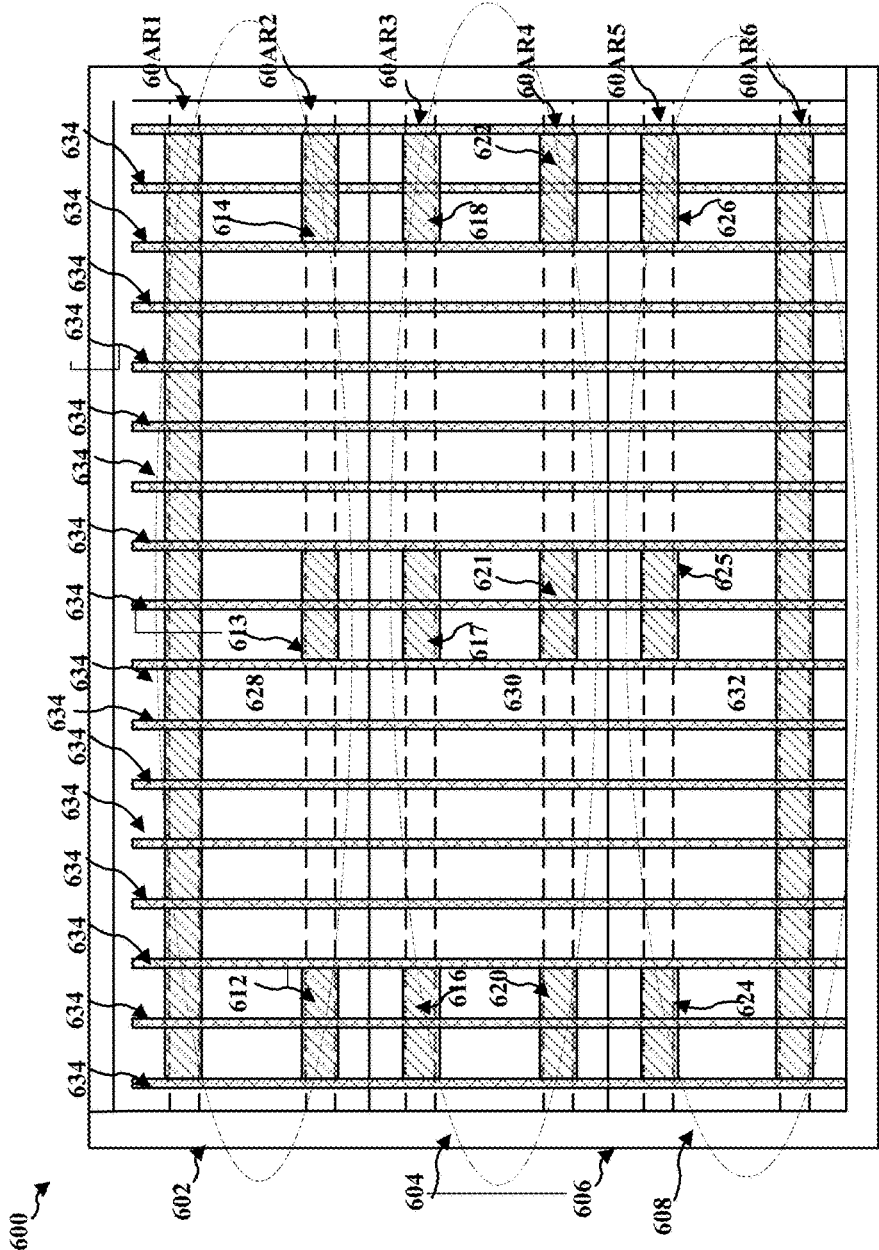

VISIBLE ALIGNMENT MARKERS/LANDMARKS FOR CAD-TO-SILICON BACKSIDE IMAGE ALIGNMENT

CROSS-REFERENCE TO RELATED APPLICATION(S)

This application claims the priority benefit of U.S. Provisional Application Ser. No. 62/573,556, entitled "VISIBLE ALIGNMENT MARKERS/LANDMARKS FOR CAD-TO-SILICON BACKSIDE IMAGE ALIGNMENT" and filed on Oct. 17, 2017, which is expressly incorporated by reference herein in its entirety.

FIELD

The present disclosure relates generally to semiconductor design, and more particularly, to visible alignment markers on active silicon substrate for computer-aided design (CAD)-to silicon backside image alignment.

BACKGROUND

Laser voltage imaging (LVI) and Laser voltage probing (LVP) are laser-based voltage and timing waveform acquisition techniques used to perform failure analysis on flip-chip integrated circuits (ICs) or to localize failures in ICs. The LVP tool CAD alignment process includes a coarse three point alignment at very low magnification using air gap lens, followed by a fine CAD alignment at very high magnification using solid immersion lens (SIL). The SIL is a spring-loaded lens that makes direct contact with the backside of the silicon substrate of the IC for high resolution imaging (e.g., LVI, Laser Scanning Microscope (LSM) image). However, due to the spring nature of the SIL, the LSM image can be slightly off with respect to the CAD when the SIL first makes a contact with the silicon substrate or whenever the SIL shifts to a different location. In 10 nm and smaller IC technology, with the increasing density and decreasing feature sizes, the current electrical fault isolation (EFI) tools (e.g., LVP) are reaching the limit of image resolution, which consequently translates to problems with CAD-to-image alignment, since it becomes very hard to distinguish one feature from another. Therefore, there is a need for visible alignment markers in 10 nm and smaller IC technology for a precise local CAD-to-silicon navigation or alignment during the LVP measurement of an IC for EFI to ensure that the correct standard cell or signal is being probed.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In 10 nm and smaller IC technology, with the increasing density and decreasing feature sizes, the current EFI tools (e.g., LVP) are reaching the limit of image resolution, which consequently translates to problems with CAD-to-image alignment, since it becomes very hard to distinguish one feature from another. Therefore, there is a need for visible alignment markers in 10 nm and smaller IC technology for a precise local CAD-to-silicon alignment during the LVP measurement of an IC for EFI to ensure that the correct standard cell or signal is being probed. It should be noted that while some of the specific examples provided herein are for 7 nm IC technology, the concepts discussed herein may be applicable to all advanced process technologies including 10 nm, 8 nm, 6 nm, 4 nm, and below.

In an aspect of the disclosure, a metal oxide semiconductor (MOS) IC having a plurality of fiducial standard cells is disclosed. The plurality of fiducial standard cells include a plurality of different cell sizes. The different cell sizes are non-equally utilized among the plurality of fiducial standard cells. The plurality of fiducial standard cells are placed to have a random offset from a uniform global placement pattern to facilitate identification of the fiducial standard cells in the MOS IC and to allow alignment between the scanned images and the CAD image of the MOS IC.

The MOS fiducial standard cell includes at least four power rails extending in a first direction across the IC. The at least four power rails are coupled to a first voltage source or to a second voltage source different than the first voltage source. One or more sets of active regions are adjacent to each of the power rails. Each of the active regions is collinear in the first direction. At least one of the active regions include at least two disjoint active regions. Each of the active regions is disconnected from contacts and interconnects and thus does not draw power from, or drain power to, the power rails. However, the disjoint active regions create islands of active regions among spacing of inactive regions. These inactive regions more easily allow electromagnetic radiation to pass through thereby allowing the fiducial standard cells to be visible for a CAD-to-silicon backside image alignment even with feature sizes less than 10 nm.

In an aspect of the disclosure, a method of placing a plurality of fiducial standard cells in a MOS IC is disclosed. The method includes determining a region of the MOS IC for placing the plurality of fiducial standard cells. The region has an x-direction and a y-direction. The method also includes subtracting a dither range in the x-direction from one half of a maximum distance in the x-direction between a non-fiducial standard cell and one of the plurality of fiducial standard cells to generate an x-direction half-stepping distance. The method also includes subtracting a dither range in the y-direction from one half of a maximum distance in the y-direction between a non-fiducial standard cell and one of the plurality of fiducial standard cells to generate a y-direction half-stepping distance. The method further includes determining a random dither in the x-direction and a random dither in the y-direction. The random dither in the x-direction ranges from a minus half to a positive half times the dither range in the x-direction. Similarly, the random dither in the y-direction ranges from a minus half to a positive half times the dither range in the y-direction. The method further includes stepping through the x-direction of the region by successively adding twice the x-direction half-stepping distance by the random dither in the x-direction to determine a plurality of placement positions in the x-direction. The method further includes stepping through the y-direction of the region by successively adding twice the y-direction half-stepping distance by the random dither in the y-direction to determine a plurality of placement positions in the y-direction. The method includes placing the plurality of fiducial standard cells at locations based on the plurality of placement positions in the x-direction and the plurality of placement positions in the y-direction.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 6A and 6B illustrate yet another exemplary MOS fiducial standard cell IC.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of semiconductor systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

LVI and LVP are laser-based voltage and timing waveform acquisition techniques that may be used to perform failure analysis on flip-chip ICs or to localize failures in ICs. Using the LVP technique, timing data of internal signals of the IC may be measured as waveforms directly from the P-N junctions in the IC through the backside of silicon on flip-chip devices. The LVP technique may use a CAD alignment tool to align and sync a laser scan image of the IC substrate with the chip design layout to navigate to the point of interest for probing.

Figure 1A:
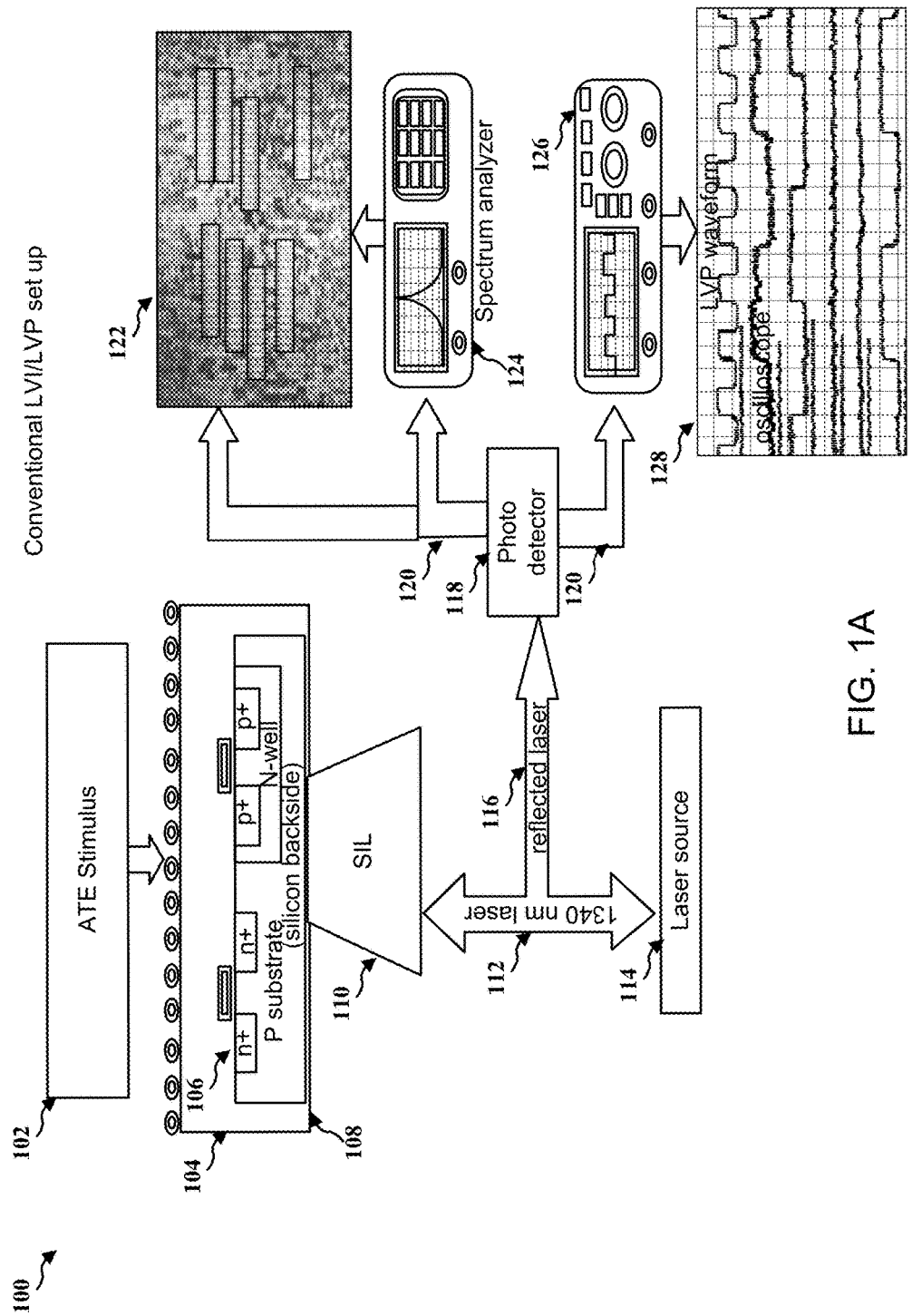
FIG. 1A illustrates a conventional LVP/LVI system setup to perform a CAD-to-silicon backside image alignment process.
Figure 1B:
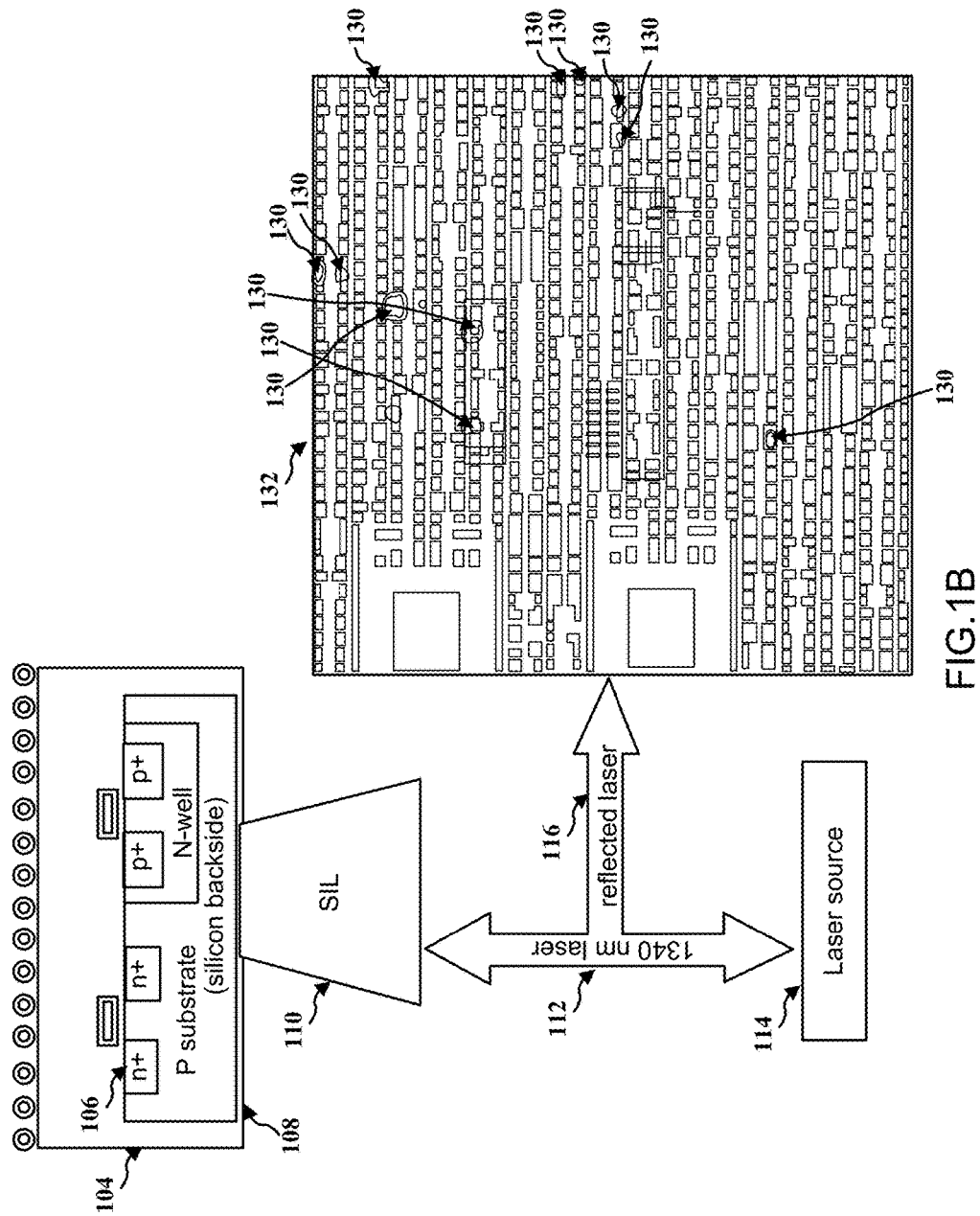
FIG. 1B illustrates a portion of the LVP/LVI system of FIG. 1A and an acquisition of LSM image.

FIG. 1A illustrates a conventional LVP/LVI system 100 setup to perform a CAD-to-silicon backside image alignment process. FIG. 1B illustrates a portion of the conventional LVP/LVI system 100 and an acquisition of an LSM image. Typically, in order to perform LVI/LVP, the device 104 to be analyzed is de-encapsulated in order to expose the backside 108 of the silicon substrate 106. The silicon substrate 106 may be thinned mechanically using a back side mechanical thinning tool. The thinned device 104 is then mounted on a movable stage and connected to an electrical stimulus source called automatic test equipment (ATE) stimulus 102. Signal measurements may be performed through the back side 108 of the device 104 after silicon substrate 106 thinning has been performed. The device 104 being probed may be electrically stimulated using a repeating test pattern, with a trigger pulse provided to the LVP as a reference.

A laser beam 112 from a laser 114 may scan the backside 108 of the silicon substrate 106 via a high magnification SIL 110 and may be reflected back 116 to a photo detector 118. The laser beam 112 may be focused onto the active layer of the silicon substrate 106 so that the reflected beam 116 may provide physical details of the scanned active area of the silicon substrate 106 as an LSM image 132. Simultaneously during this scan, the reflected beam 116 may be modulated by the signal on each transistor in the scanned area of the silicon substrate 106. The high frequency component 120 of the reflected beam 116 of laser may be supplied to the input of a spectrum analyzer (SA) 124 that may be tuned to a specific frequency. The SA 124 may provide an LVI image 122, which may provide information about the reflected beam 116 of the laser in the frequency domain. As shown in FIG. 1A, in some cases, the high frequency component 120 of the reflected beam 116 of the laser may be supplied to an oscilloscope 126 to provide information in the time domain as an LVP waveform 128. If a transistor is toggling at the target specific frequency, then that transistor is highlighted in the LVI image 122, creating a spatial map 130 of the target toggling frequency when overlaid onto an LSM image 132. A user performing the LVP/LVI measurement can see at a glance if the transistors in that field of view (FOV) match expected toggling behavior. Once a suspected transistor is identified, further information can be collected using LVP.

The LVP tool CAD alignment process, as shown in FIGS. 1A, 1B, is composed of a coarse, three point alignment using a low magnification air gap lens, followed by a fine CAD alignment at very high magnification SIL 110 (e.g., LVI image 122 overlaid onto the LSM image 132 to create a spatial map 130 of the target toggling frequency). The SIL 110 is a spring-loaded lens that makes direct contact with the backside 108 of the silicon substrate 106 for high resolution imaging (e.g., LVI image 122, LSM image 132). However, due to the spring nature of the SIL 110, the LSM image 132 can be slightly off with respect to the CAD when the SIL first makes a contact with the silicon substrate 106 or whenever the SIL shifts to a different location. In 10 nm and smaller technology, such offset may create problems in performing CAD-to-silicon alignment if there is a lack of unique features/visible alignment markers that may help with the orientation of the LVI image 122 or LSM image 132. The visible alignment markers in the active layer of a silicon substrate may be used for CAD-to-silicon alignment of different EFI tools such as the LVP, Dynamic Laser Stimulation (DLS), and IR Emission (IREM) tools.

In particular, in 7 nm and smaller process technologies, with the increasing density and decreasing feature sizes, the current EFI tools are reaching the limit of image resolution, which may consequently translate to problems with CAD-to-image alignment, since it becomes very hard to distinguish one feature from another. For example, the feature sizes have significantly decreased from 10 nm to 9 nm, 8 nm, 7 nm, 6 nm, and 5 nm. For example, in the 7 nm process, techniques described below may be implemented to ensure visibility of features. Therefore, there is a need for visible alignment markers in 7 nm and smaller technologies for a precise local alignment of CAD-to-silicon during the LVP measurement of an IC for EFI to ensure that the correct cell or signal is being probed.

It should be noted that while the specific examples provided herein in FIGS. 2, 4A, 4B, 5A, 5B, 6A, 6B, 7A and 7B are for a 7 nm process technology, the concepts discussed herein may be applicable to all advanced process technologies including 9 nm, 8 nm, 7 nm, 6 nm, and 5 nm.

Figure 2:
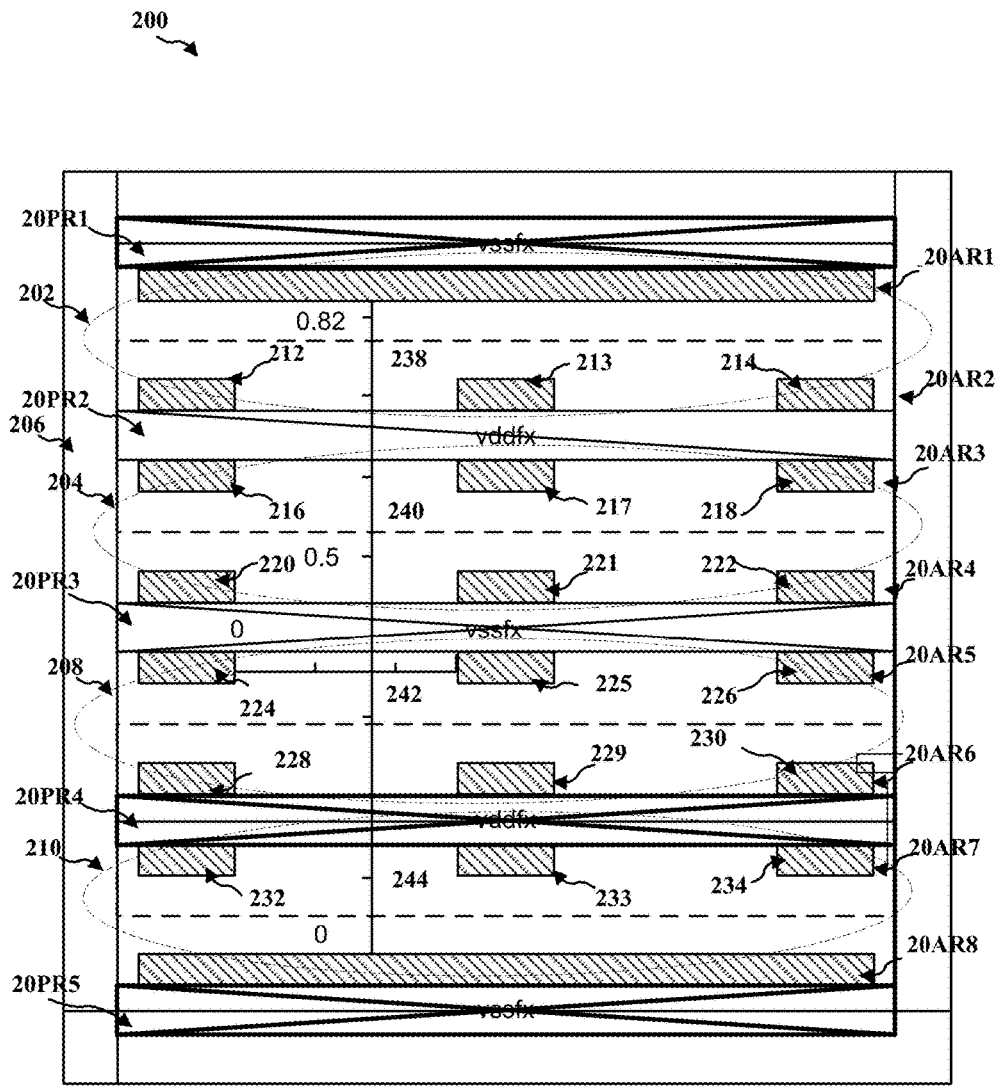
FIG. 2 illustrates an exemplary layout of a location in the active layer within a 7 nm process technology.

FIG. 2 illustrates an exemplary layout of a location in the active layer within a 7 nm process technology. In an exemplary layout, the diffusion may be made discontinuous in the active layer, which allows for reflection from the metal 0 (M0) structures described below thereby allowing CAD-to-image alignment. More specifically, due to more restrictive layout design rules in 9 nm, 8 nm, 7 nm, 6 nm, and 5 nm, the layout design of a MOS standard fiducial cell IC may not have a large space between diffusion polygons (the MOS standard fiducial cell IC may also be referred to as a MOS standard fiducial cell). Instead the MOS standard fiducial cells may have small islands of diffusion with large inactive regions. The diffusion islands are small and sparse such that the inactive region of the MOS standard fiducial cell is perceived as an opening in the diffusion of non-fiducial standard cells and thereby allows for reflection of a laser beam from M0 metal layers, as explained in further detail below.

More specifically, FIG. 2 is an example diagram illustrating a plan view of an example MOS standard fiducial cell IC 200 including a first portion 202, a second portion 204, a third portion 208, and a fourth portion 210 formed on a p-type substrate 206 (e.g., silicon substrate). The MOS standard fiducial cell IC 200 has at least four power rails extending in a first direction across the IC. In this example, the MOS standard fiducial cell IC 200 includes five power rails 20PR1, 20PR2, 20PR3, 20PR4, 20PR5 each extending in a first direction. The MOS standard fiducial cell IC 200 may also be a 7 nm standard cell. Additionally, there are eight sets of active regions 20AR1, 20AR2, 20AR3, 20AR4, 20AR5, 20AR6, 20AR7, 20AR8. This example is the tallest and widest of the MOS standard fiducial cells in that the MOS standard fiducial cell IC 200 is 17 placement grids wide and 4 standard cell rows tall (grids may be units of standard cell layout in the x-direction and standard cell rows may be units of standard cell layout in the y-direction). The 20PR1, 20PR2, 20PR3, 20PR4, 20PR5 are each separated in a second direction, orthogonal to the first direction, by approximately 220 nm. As explained in further detail below, the eight sets of active regions 20AR1, 20AR2, 20AR3, 20AR4, 20AR5, 20AR6, 20AR7, 20AR8 are disconnected from contacts and interconnects and thus are not connected to the five power rails 20PR1, 20PR2, 20PR3, 20PR4, 20PR5. Instead, the MOS standard fiducial cell IC 200 is designed to increase visibility of features during the LVP measurement of an IC, as explained in further detail below. Thus, the MOS standard fiducial cell IC 200 is not designed to provide active semiconductor components but rather to serve as a reference location that can be easily identified during the LVP tool CAD alignment process.

The power rail 20PR1 is configured to provide a negative supply voltage or a ground (e.g., Vss, ground) to the first portion 202 of the MOS standard fiducial cell IC 200. Furthermore, the set of active regions 20AR1 is adjacent to the power rail 20PR1. In this example, the set of active regions 20AR1 is formed as a one continuous active region that extends in the first direction along the entire width of the MOS standard fiducial cell IC 200. More specifically, the power rail 20PR1 is adjacent to the one continuous active region 20AR1.

The power rail 20PR2 is configured to provide a positive supply voltage (e.g., Vdd) to the first portion 202 and the second portion 204 of the MOS standard fiducial cell IC 200. Furthermore, the set of active regions 20AR2 is adjacent to one side of the power rail 20PR2 and the set of active regions 20AR3 is adjacent to a second side of the power rail 20PR2. In this example, the set of active regions 20AR2 is formed as three disjoint active regions 212, 213, 214 on a first side of the power rail 20PR2. The active regions 212, 214 are each on distal sides of the IC, which are shown as the left side and the right side of the IC in FIG. 2. More specifically, the active region 212 is on one side of the IC while the active region 214 is on the opposite side of the IC. The active region 213 is in a central portion between the left side and the right side and thus between the active regions 212, 214.

The set of active regions 20AR3 is also formed as three disjoint active regions 216, 217, 218 on a second side of the power rail 20PR2 opposite the first side. The three disjoint active regions 216, 217, 218 are separated by less than 300 nm (e.g., approximately 277 nm). The active regions 216, 217, 218 are collinear in the first direction. The active regions 216, 218 are each on distal sides of the IC, which are shown as the left side and the right side of the IC in FIG. 2. More specifically, the active region 216 is on one side of the IC while the active region 218 is on the opposite side of the IC. The active region 217 is in a central portion between the left side and the right side and thus between the active regions 216, 218.

The power rail 20PR3 is configured to provide a negative supply voltage or a ground (e.g., Vss, ground) to the second portion 204 and the third portion 208 of the MOS standard fiducial cell IC 200. Furthermore, the set of active regions 20AR4 is adjacent to one side of the power rail 20PR3 and the set of active regions 20AR5 is adjacent to a second side of the power rail 20PR3. In this example, the set of active regions 20AR4 is formed as a three disjoint active regions 220, 221, 222 on a first side of the power rail 20PR3. The three disjoint active regions 220, 221, 222 are separated by less than 300 nm (e.g., approximately 277 nm). The active regions 220, 221, 222 are collinear in the first direction. The active regions 220, 222 and are each on distal sides of the IC, which are shown as the left side and the right side of the IC in FIG. 2. More specifically, the active region 220 is on one side of the IC while the active region 222 is on the opposite side of the IC. The active region 221 is in a central portion between the left side and the right side and thus between the active regions 220, 222.

The set of active regions 20AR5 is also formed as a three disjoint active regions 224, 225, 226 on a second side of the power rail 20PR3 opposite the first side. The three disjoint active regions 224, 225, 226 may be separated by less than 300 nm (e.g., approximately 277 nm). The active regions 224, 225, 226 are collinear in the first direction. The active regions 224, 226 are each on distal sides of the IC, which are shown as the left side and the right side of the IC in FIG. 2. More specifically, the active region 224 is on one side of the IC while the active region 226 is on the opposite side of the IC. The active region 225 is in a central portion between the left side and the right side and thus between the active regions 224, 226.

The power rail 20PR4 is configured to provide a positive supply voltage (e.g., Vdd) to the third portion 208 and the fourth portion 210 of the MOS standard fiducial cell IC 200. Furthermore, the set of active regions 20AR6 is adjacent to one side of the power rail 20PR4 and the set of active regions 20AR7 is adjacent to a second side of the power rail 20PR4. In this example, the set of active regions 20AR6 is formed as a three disjoint active regions 228, 229, 230 on a first side of the power rail 20PR4. The three disjoint active regions 228, 229, 230 are separated by less than 300 nm (e.g., approximately 277 nm). The active regions 228, 230 are collinear in the first direction. The active regions 228, 230 are each on distal sides of the IC, which are shown as the left side and the right side of the IC in FIG. 2. More specifically, the active region 228 is on one side of the IC while the active region 230 is on the opposite side of the IC. The active region 229 is in a central portion between the left side and the right side and thus between the active regions 228, 230.

The set of active regions 20AR7 is also formed as a three disjoint active regions 232, 233, 234 on a second side of the power rail 20PR4 opposite the first side. The three disjoint active regions 232, 233, 234 may be separated by less than 300 nm (e.g., approximately 277 nm). The active regions 232, 233, 234 are collinear in the first direction. The active regions 232, 234 are each on distal sides of the IC, which are shown as the left side and the right side of the IC in FIG. 2. More specifically, the active region 232 is on one side of the IC while the active region 234 is on the opposite side of the IC. The active region 233 is in a central portion between the left side and the right side and thus between the active regions 232, 234.

The power rail 20PR5 is configured to provide a negative supply voltage (e.g., Vss, ground) to the fourth portion 210 of the MOS standard fiducial cell IC 200. Furthermore, the set of active regions 20AR8 is adjacent to the power rail 20PR5. In this example, the set of active regions 20AR8 is formed as a one continuous active region that extends in the first direction along the entire width of the MOS standard fiducial cell IC 200. More specifically, the power rail 20PR5 is adjacent to the one continuous active region.

As shown in FIG. 2, each of the active regions 212, 216, 220, 224, 228, 232 are aligned along the second direction, each of the active regions 213, 217, 221, 225, 229, 233 are aligned along the second direction, and each of the active regions 214, 218, 222, 226, 230, 234 are aligned (i.e., occupy the same grid in the x-direction) along the second direction. Furthermore, the region of the p-type substrate 206 that does not have a power rail or an active region is an inactive region. For example, the regions of the p-type substrate 206 between the active regions 212 and 213, active regions 213 and 214, active regions 216 and 217, active regions 217 and 218, active regions 220 and 221, active regions 221 and 222, active regions 224 and 225, active regions 225 and 226, active regions 228 and 229, active regions 229 and 230, active regions 232 and 233, active regions 233 and 234, between the active region 20AR1 and the power rail 20PR2, between the power rail 20PR2 and the power rail 20PR3, between the power rail PR3 and the power rail PR4 and between the power rail 20PR4 and the active region 20AR8 are inactive regions 238, 240, 242, 244 of the first portion 202, the second portion 204, the third portion 208, and fourth portion 210 respectively. Thus, the inactive regions 238, 240, 242, 244 may be used to electrically isolate adjacent active regions within MOS standard fiducial cell IC 200 and/or to electrically isolate adjacent standard cell devices from each other. As explained in further detail below, a Metal 0 (M0) structure (not completely shown) is provided over the inactive regions 238, 240, 242, 244. Metal 0 (M0) interconnects reflect more or substantially more electromagnetic radiation/laser beam compared to the active regions 20AR1, 212, 213, 214, 216, 217, 218, 220, 221, 222, 224, 225, 226, 228, 229, 230, 232, 233, 234, 20AR8. That is, the active regions 20AR1, 20AR2, 20AR3, 20AR4, 20AR5, 20AR6, 20AR7, 20AR8 block electromagnetic radiation. The inactive regions 238, 240, 242, 244 allow for the electromagnetic radiation to pass through and be reflected by the M0 interconnects. The first portion 202, second portion, 204, third portion 208, and the fourth portion 210 are all adjacent relative to the second direction so that the MOS standard fiducial cell IC 200 has a height of approximately 960 nm. The combination of the inactive regions 238, 240, 242, 244 in combination with the spacing between the disjointed set of active regions 20AR2, 20AR3, 20AR4, 20AR5, 20AR6, 20AR7 allow enough electromagnetic radiation to be reflected off the M0 interconnects for the MOS standard fiducial cell IC 200 to be detected during the LVI/LVP CAD-to-silicon alignment when 7 nm process technology is implemented.

Also, as mentioned above, the MOS standard fiducial cell IC 200 is a passive cell, which means the MOS standard fiducial cell IC 200 does not draw power from, or drain power to, the power rails 20PR1, 20PR2, 20PR3, 20PR4, 20PR5, even though the MOS standard fiducial cell IC 200 is connected to the power rails 20PR1, 20PR2, 20PR3, 20PR4, 20PR5.

Figure 3A:
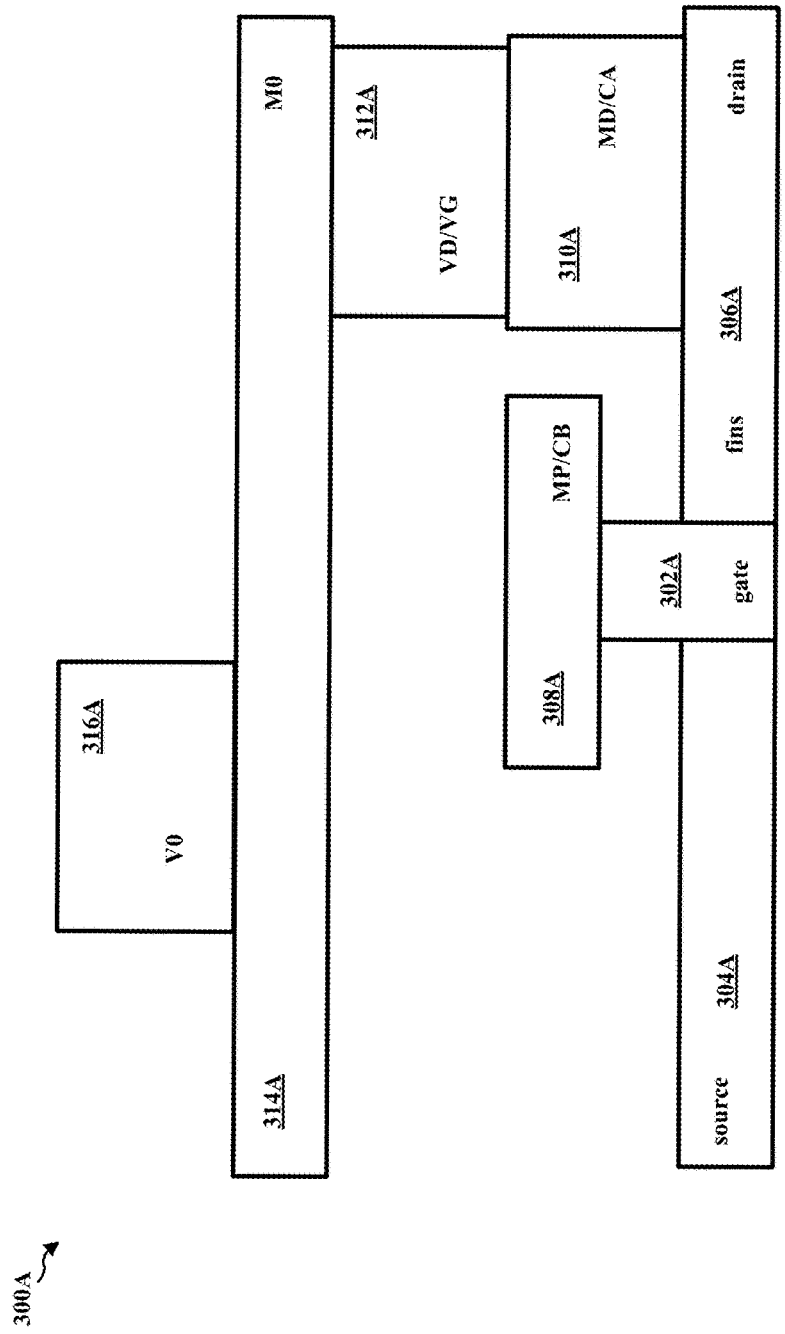
FIGS. 3A and 3B are diagrams illustrating a side view of various layers within a standard cell.

FIG. 3A is a first diagram 300A illustrating a side view of various layers within a standard cell and IC. As illustrated in FIG. 3A, a transistor has a gate 302A, a source 304A, and a drain 306A. The source 304A and the drain 306A may be formed by fins. A contact B (CB) layer interconnect 308A (also referred to as a metal POLY (MP) layer interconnect) may contact the gate 302A. A contact A (CA) layer interconnect 310A (also referred to as a metal diffusion (MD) layer interconnect) may contact the source 304A or the drain 306A. A via 312A (which may be referred to as via D (VD) or via G (VG)) may contact the CA layer interconnect 310A. The vias VD, VG 312A are formed by separate masks in at least a double patterning process. An M0 layer interconnect 314A contacts the via VD/VG 312A. A via V0 316A may contact the M0 layer interconnect 314A.

Figure 3B:
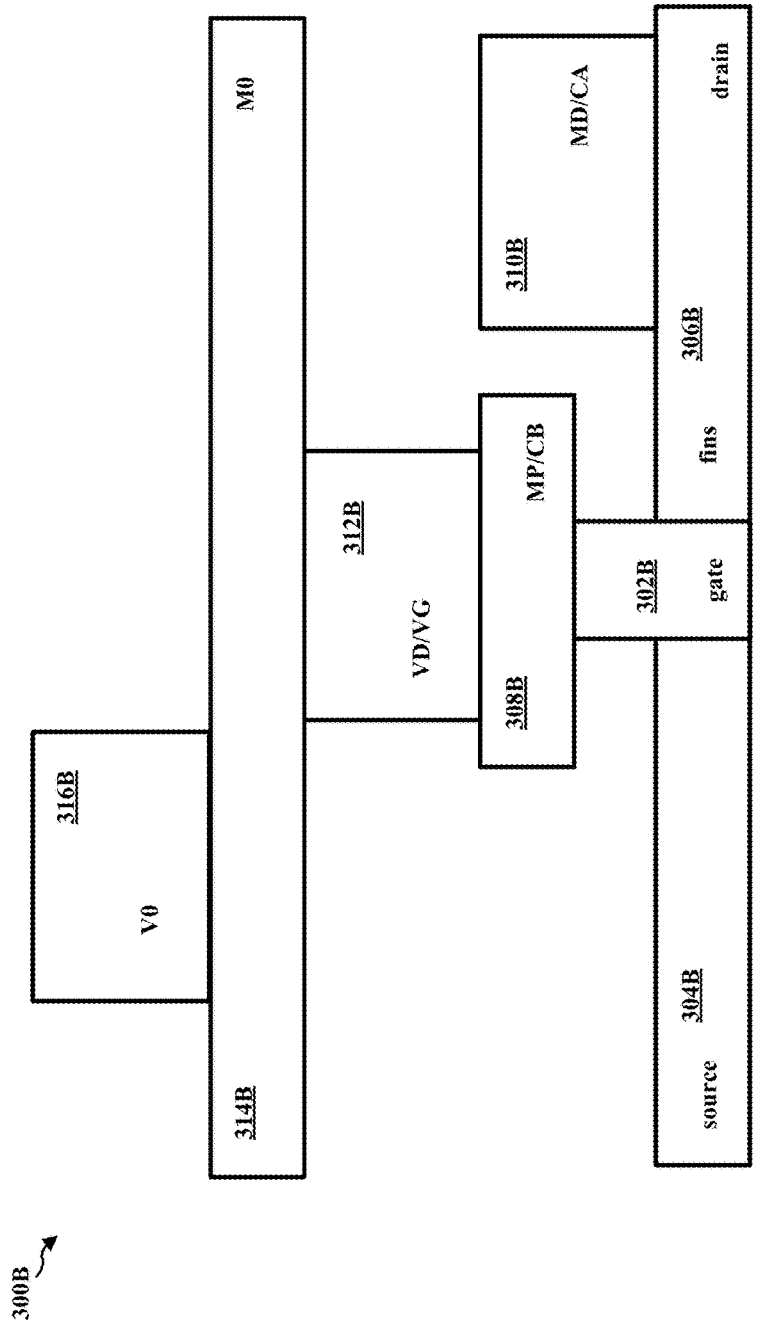

FIG. 3B is a second diagram 300B illustrating a side view of various layers within a standard cell and IC. As illustrated in FIG. 3B, a transistor has a gate 302B, a source 304B, and a drain 306B. The source 304B and the drain 306B may be formed by fins. A CB layer interconnect 308B may contact the gate 302B. A CA layer interconnect 310B may contact the source 304B or the drain 306B. A via 312B VD/VG may contact the CB layer interconnect 308B. An M0 layer interconnect 314B contacts the via VD/VG 312B. A via V0 316B may contact the M0 layer interconnect 314B.

However, with respect to FIG. 2 above and FIGS. 4A, 4B, 5A, 5B, 6A, 6B, 7A, 7B below, the M0 layer interconnects 314A, 314B are disconnected from the components 302A-310A and from components 302B-310B such that the MOS standard fiducial cells do not provide active semiconductor devices, e.g., active transistors. Accordingly, no vias 312A or 312B are provided in the MOS standard fiducial cell ICs shown in FIG. 2 above and FIGS. 4A, 4B, 5A, 5B, 6A, 6B, 7A, 7B below.

Figure 5A:
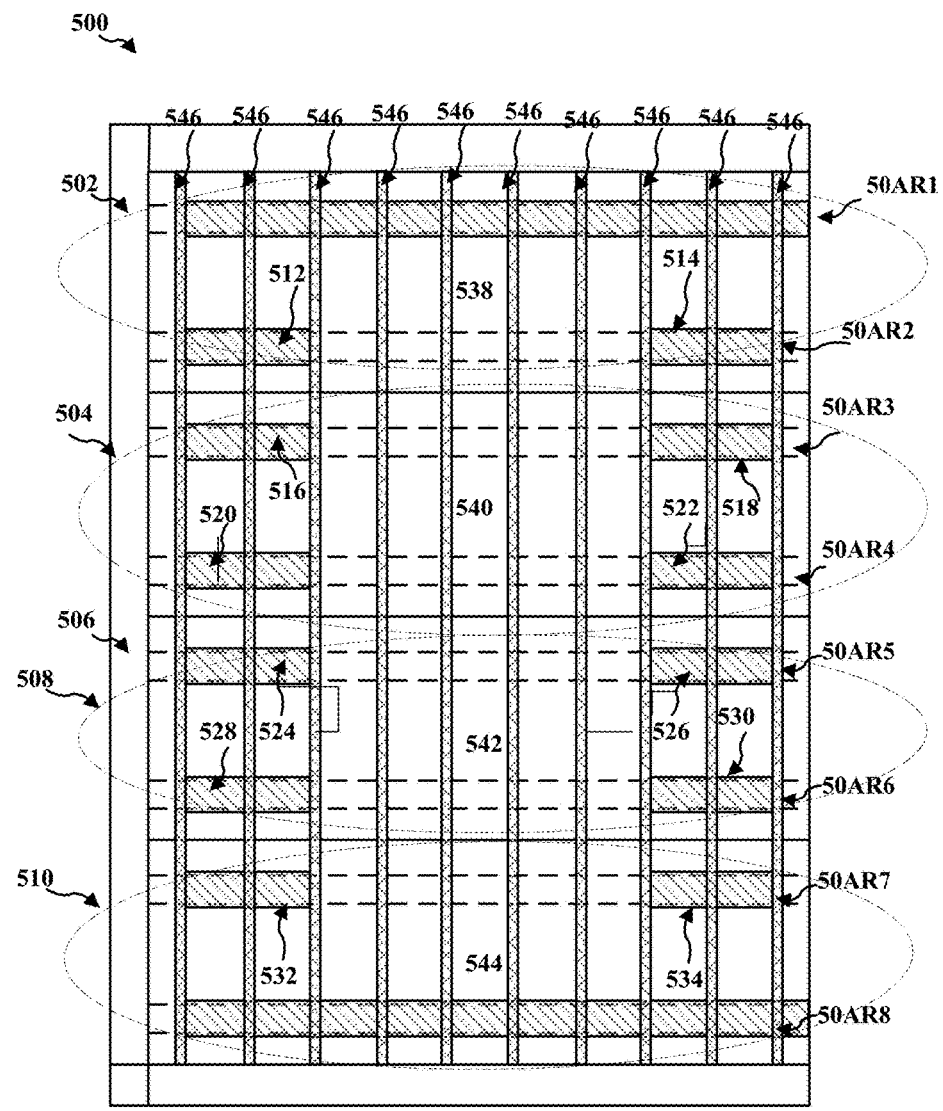
FIGS. 5A and 5B illustrate another exemplary MOS fiducial standard cell IC.
Figure 5B:
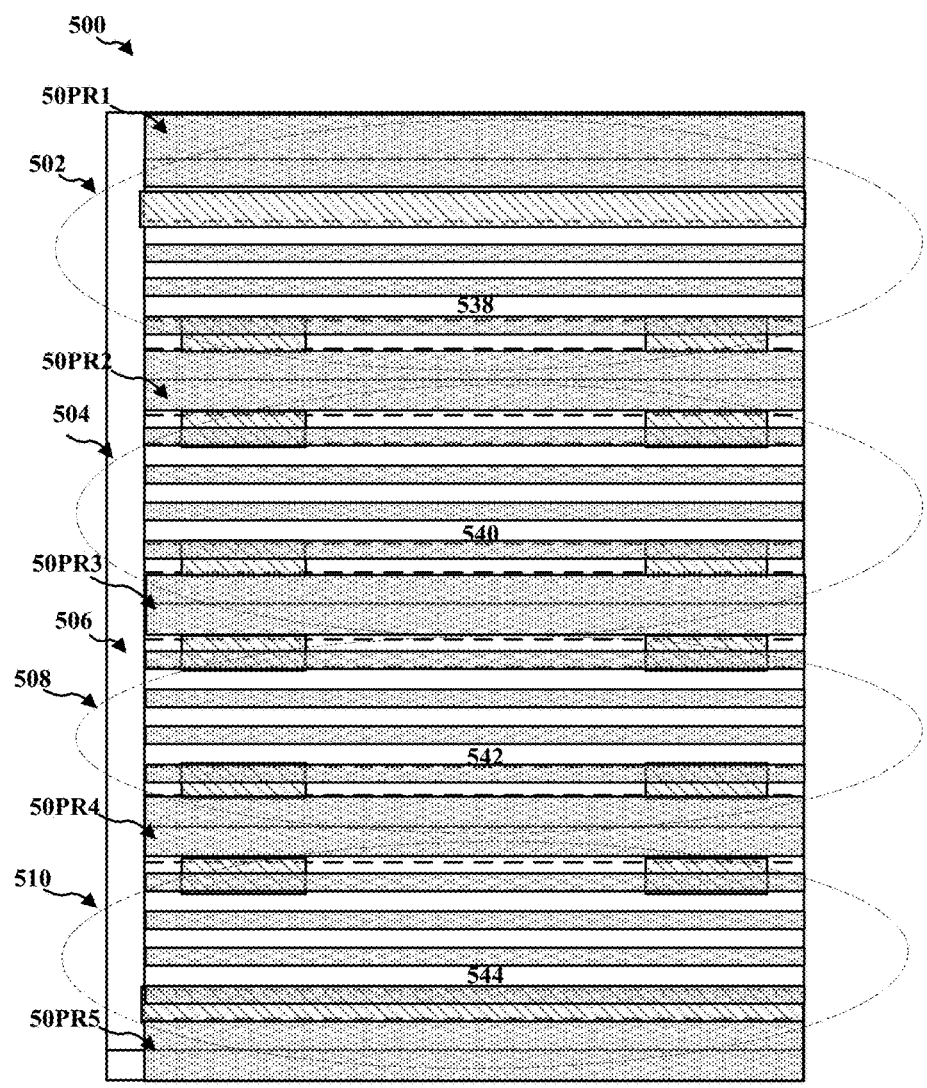
Figure 6B:
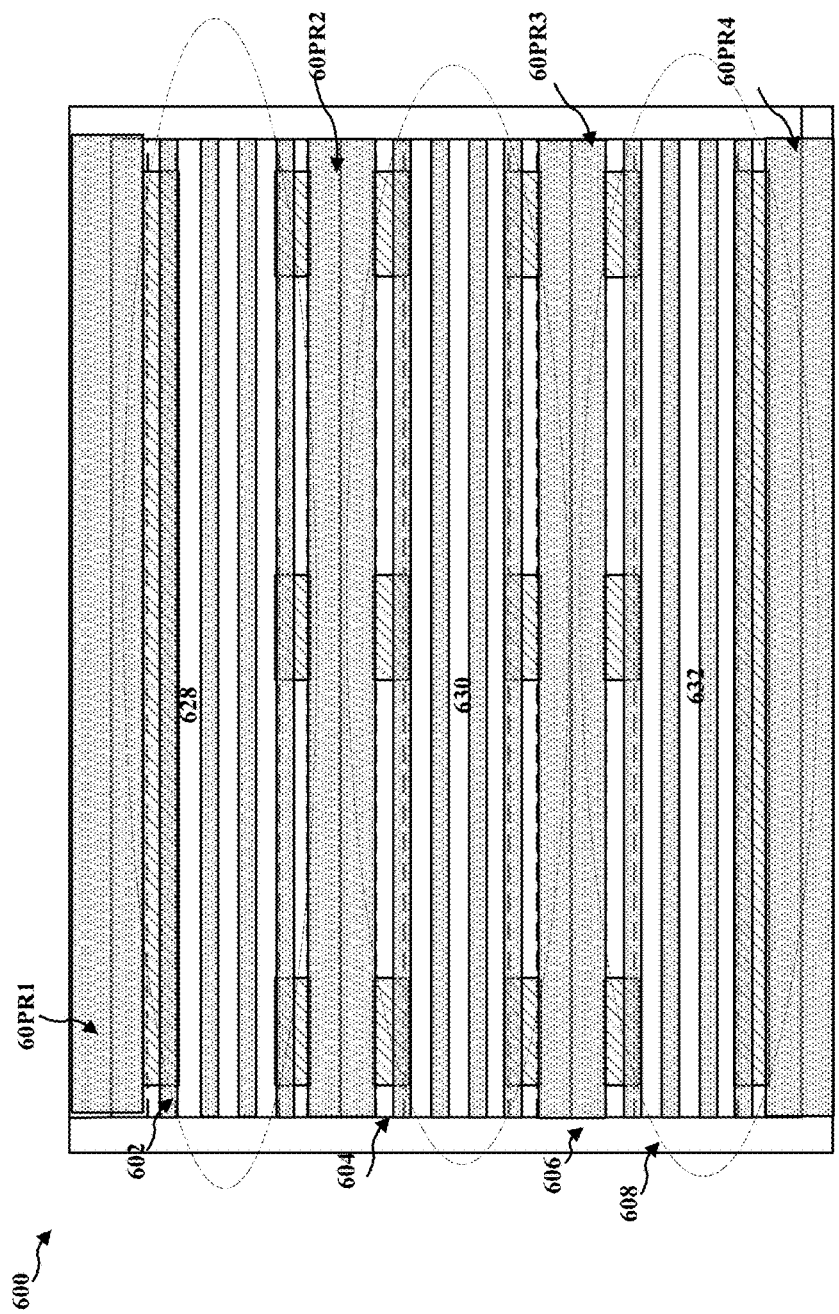
Figure 7A:
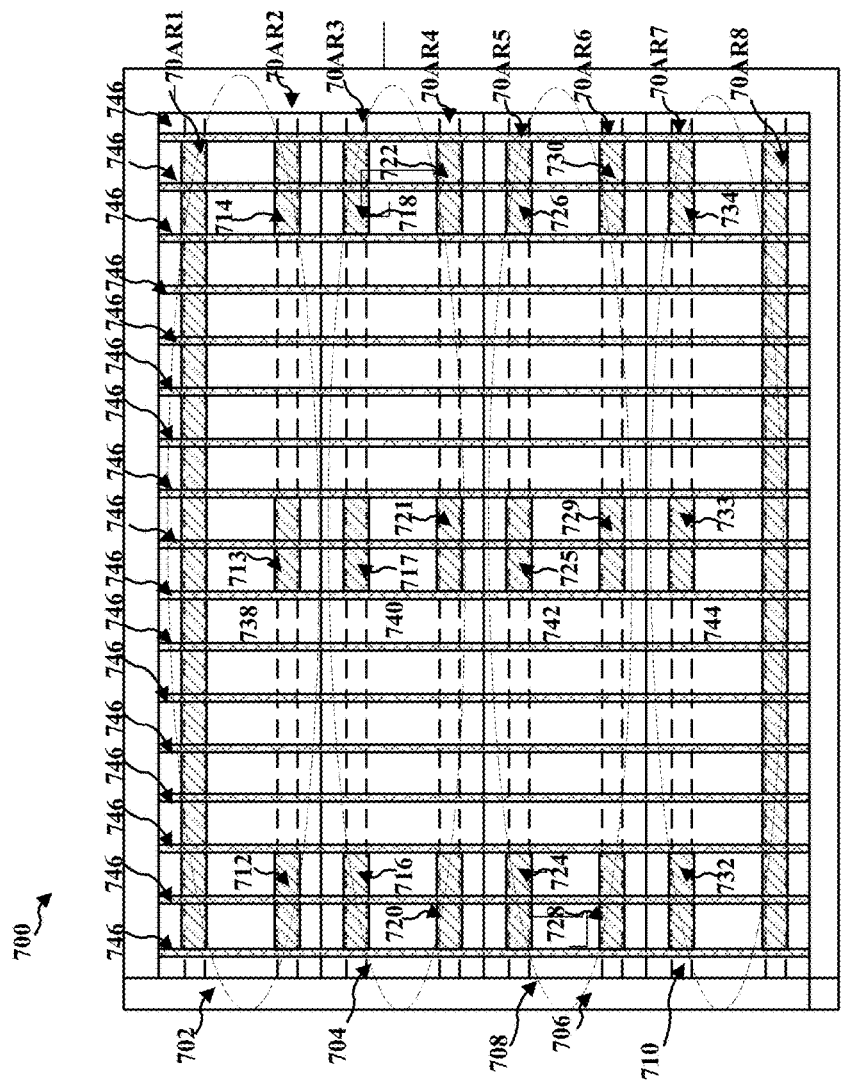
FIGS. 7A and 7B illustrate still another exemplary MOS fiducial standard cell IC.
Figure 7B:
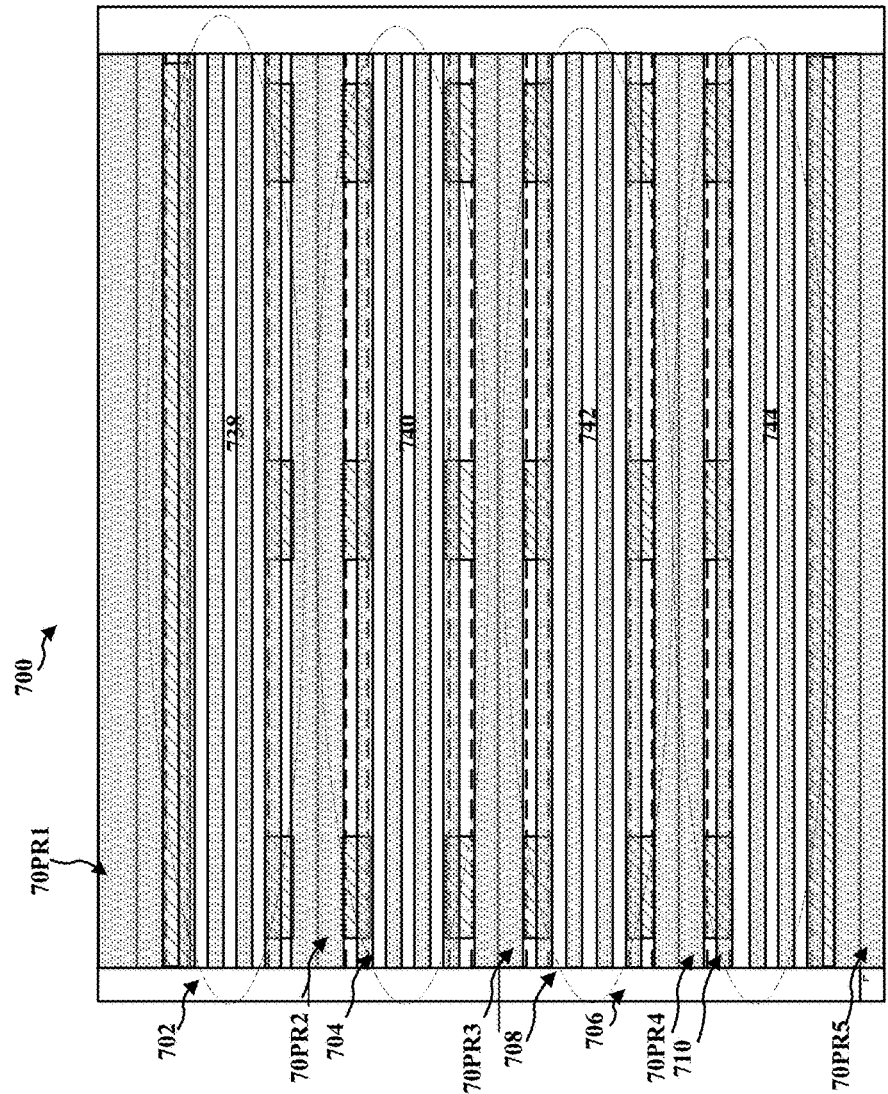

In FIGS. 4A, 4B, 5A, 5B, 6A, 6B, 7A, 7B, four types of MOS standard fiducial cells 400, 500, 600, 700 are described. The MOS standard fiducial cell 700 in FIG. 7A, 7B is the same as the MOS standard fiducial cell shown in FIG. 2. This is the most common type of MOS standard fiducial cell utilized because the MOS standard fiducial cell 700 has the highest visibility (e.g., its inactive region is most visible as an opening in the diffusion layer of non-fiducial standard cells), as explained below. However, the four different types of MOS standard fiducial cells 400, 500, 600, 700 may be distributed throughout the standard cells in an IC since unique patterns can be created, thereby making identification of the MOS standard fiducial cells 400, 500, 600, 700, and CAD-to-silicon alignment, easier.

The perceived opening in the diffusion is slightly different for each type of MOS standard fiducial cell ICs 400, 500, 600, 700. However, by creating disjoint active regions, inactive regions are provided that allow sufficient reflection from M0 layer interconnects, thereby allowing the MOS standard fiducial cell ICs 400, 500, 600, 700 to be identified.

Figure 4A:
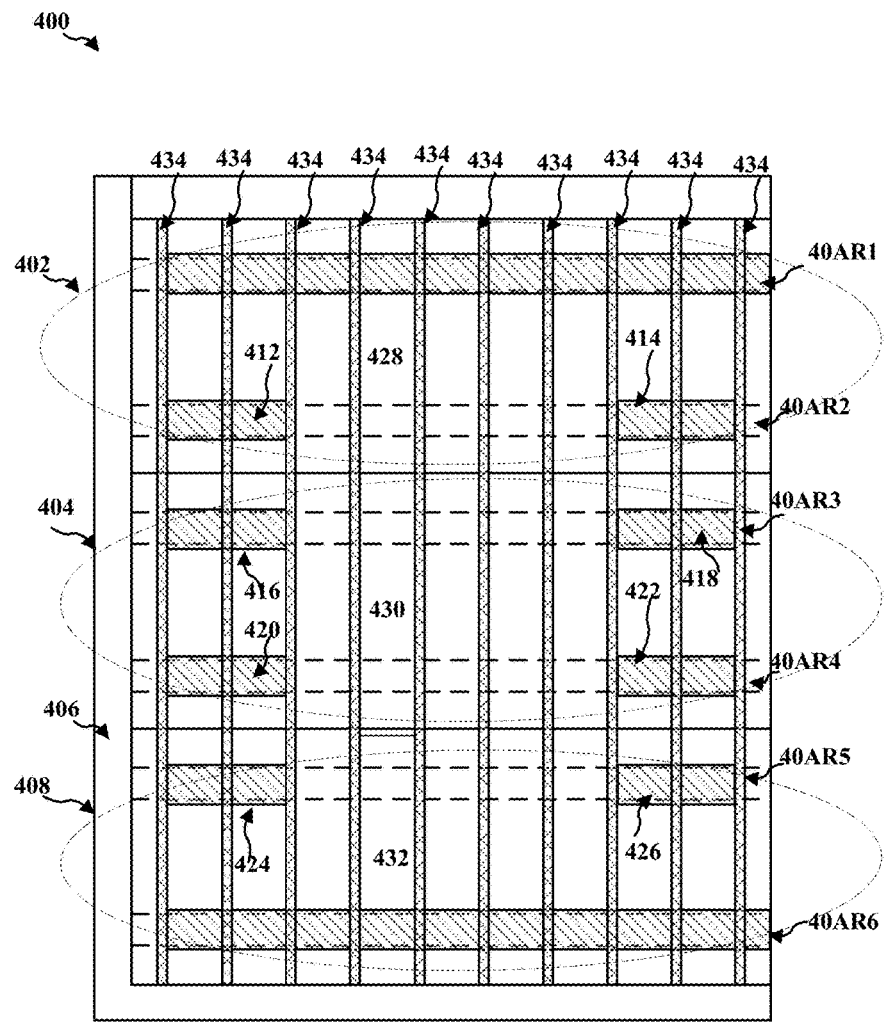
FIGS. 4A and 4B illustrate an exemplary MOS fiducial standard cell IC.
Figure 4B:
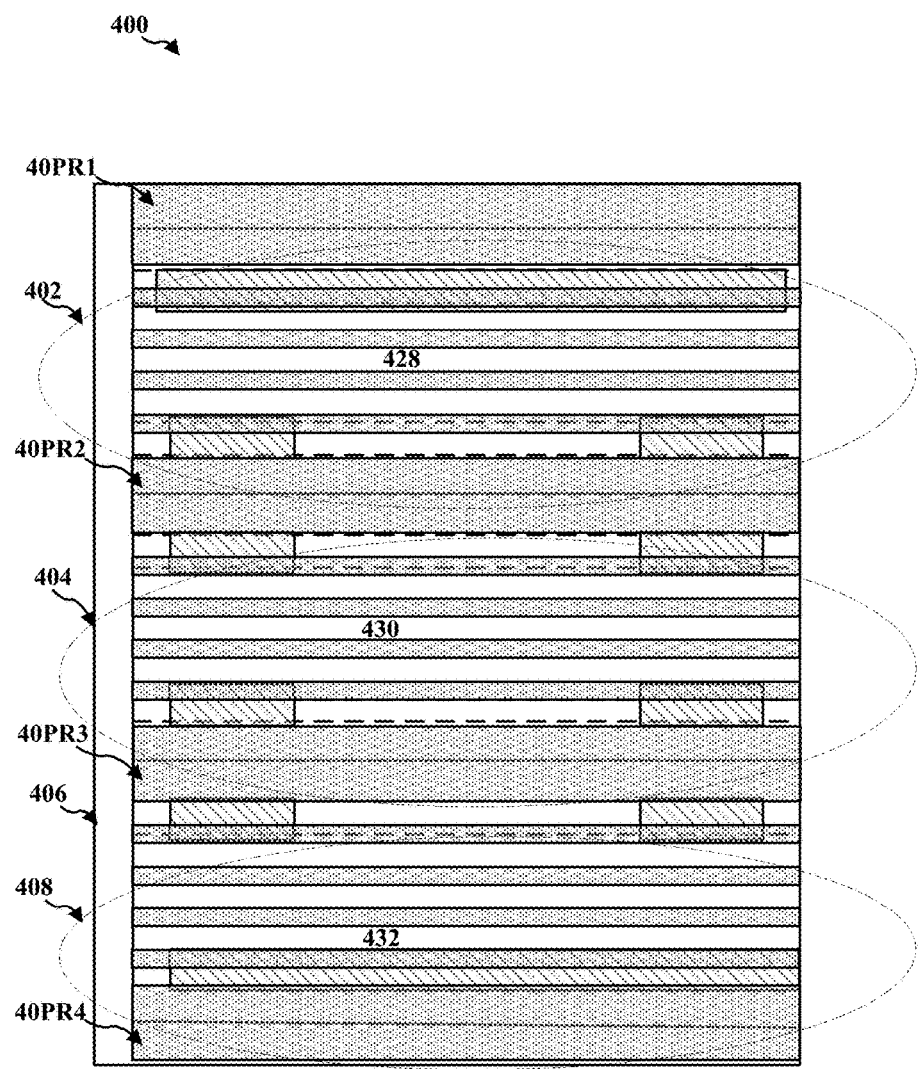

FIGS. 4A and 4B are example diagrams illustrating a plan views of an example MOS standard fiducial cell IC 400 including a first portion 402, a second portion 404, and a third portion 408, formed on a p-type substrate 406 (e.g., silicon substrate). FIG. 4A illustrates active regions and gate interconnects of the MOS standard fiducial cell IC 400. FIG. 4B illustrates a M0 metal structure of the MOS standard fiducial cell IC 400 above the gate interconnects of FIG. 4A.

The MOS standard fiducial cell IC 400 may be three cell rows in height and 10 gate spacings across and is a 7 nm standard cell. The MOS standard fiducial cell IC 400 includes four power rails 40PR1, 40PR2, 40PR3, 40PR4 each extending in a first direction. Additionally, there are six sets of active regions 40AR1, 40AR2, 40AR3, 40AR4, 40AR5, 40AR6. This example is the shortest and narrowest of the MOS standard fiducial cells in that the MOS standard fiducial cell IC 400 is 10 placement grids wide and 3 standard cell rows tall. A second direction is orthogonal to the first direction so that the 40PR1, 40PR2, 40PR3, 40PR4 are each separated in the second direction by approximately 250 nm.

The power rail 40PR1 is configured to provide a negative supply voltage or a ground (e.g., Vss, ground) to the first portion 402 of the MOS standard fiducial cell IC 400. Furthermore, the set of active regions 40AR1 is adjacent to the power rail 40PR1. In this example, the set of active regions 40AR1 is formed as one continuous active region that extends in the first direction along the entire width of the MOS standard fiducial cell IC 400. More specifically, the power rail 40PR1 is adjacent to the one continuous active region 40AR1.

The power rail 40PR2 is configured to provide a positive supply voltage (e.g., Vdd) to the first portion 402 and the second portion 404 of the MOS standard fiducial cell IC 400. Furthermore, the set of active regions 40AR2 is adjacent to one side of the power rail 40PR2 and the set of active regions 40AR3 is adjacent to a second side of the power rail 40PR2. In this example, the set of active regions 40AR2 is formed as a two disjoint active regions 412, 414 on a first side of the power rail 40PR2. The two disjoint active regions 412, 414 are separated by less than 300 nm (e.g., approximately 277 nm). The active regions 412, 414 are collinear in the first direction and are each on distal sides of the IC, which are shown as the left side and the right side of the IC in FIG. 4A. More specifically, the active region 412 is on one side of the IC while the active region 414 is on the opposite side of the IC.

The set of active regions 40AR3 is also formed as a two disjoint active regions 416, 418 on the second side of the power rail 40PR2 opposite the first side. The two disjoint active regions 416, 418 are separated by less than 300 nm (e.g., approximately 277 nm). The active regions 416, 418 are collinear in the first direction. Furthermore, the two disjoint active regions 416, 418 are each on distal sides of the IC, which are shown as the left side and the right side of the IC in FIG. 4A. More specifically, the active region 416 is on one side of the IC while the active region 418 is on the opposite side of the IC.

The power rail 40PR3 is configured to provide a negative supply voltage or a ground (e.g., Vss, ground) to the second portion 404 and the third portion 408 of the MOS standard fiducial cell IC 400. Furthermore, the set of active regions 40AR4 is adjacent to one side of the power rail 40PR3 and the set of active regions 40AR5 is adjacent to a second side of the power rail 40PR3. In this example, the set of active regions 40AR4 is formed as a two disjoint active regions 420, 422 on a first side of the power rail 40PR3. The two disjoint active regions 420, 422 are separated by less than 300 nm (e.g., approximately 277 nm). The active regions 420, 422 are collinear in the first direction. Furthermore, the two disjoint active regions 420, 422 are each on distal sides of the IC, which are shown as the left side and the right side of the IC in FIG. 4A. More specifically, the active region 420 is on one side of the IC while the active region 422 is on the opposite side of the IC.

The set of active regions 40AR5 is also formed as a two disjoint active regions 424, 426 on the second side of the power rail 40PR3 opposite the first side. The two disjoint active regions 424, 426 are separated by less than 300 nm (e.g., approximately 277 nm). The active regions 424, 426 are collinear in the first direction. Furthermore, the two disjoint active regions 424, 426 are each on distal sides of the IC, which are shown as the left side and the right side of the IC in FIG. 4A. More specifically, the active region 424 is on one side of the IC while the active region 426 is on the opposite side of the IC.

The power rail 40PR4 is configured to provide a positive supply voltage (e.g., Vdd) to the third portion 408 of the MOS standard fiducial cell IC 400. Furthermore, the set of active regions 40AR6 is adjacent to the power rail 40PR4. In this example, the set of active regions 40AR6 is formed as one continuous active region that extends in the first direction along the entire width of the MOS standard fiducial cell IC 400. More specifically, the power rail 40PR4 is adjacent to the one continuous active region.

As shown in FIG. 4A, each of the active regions 412, 416, 420, 424 are aligned in the second direction and each of the active regions 414, 418, 422, 426 are aligned in the second direction. Furthermore, the region of the p-type substrate 406 between the active regions 412 and 414, active regions 416 and 418, active regions 420 and 422, active regions 424 and 426, between the active region 40AR1 and the power rail 40PR2, between the power rail 40PR2 and the power rail 40PR3, and between the power rail 40PR3 and the active region 40AR6, are inactive regions 428, 430, 432 of the first portion 402, the second portion 404, and the third portion 408, respectively. Thus, the inactive regions 428, 430, 432 may be used to electrically isolate adjacent active regions within MOS standard fiducial cell IC 400 and/or to electrically isolate adjacent standard cell devices from each other. Above each of the inactive regions 428, 430, 432, M0 interconnects (See FIG. 4B) that extend in the first direction reflect more or substantially more electromagnetic radiation/laser beam compared to the active regions 40AR1, 412, 414, 416, 418, 420, 422, 424, 426, 40AR6, and the inactive regions 428, 430, 432 allow for that electromagnetic radiation to pass through and be reflected by the M0 interconnects. Given that the first portion 402, second portion, 404, and third portion 408 are all adjacent relative to the second direction so that the MOS standard fiducial cell IC 400 has a height of approximately 820 nm, the inactive regions 428, 430, 432 in combination with the spacing between the disjointed set of active regions 40AR2, 40AR3, 40AR4, 40AR5 allow enough electromagnetic radiation to be reflected off the M0 interconnects extending in the first direction during the LVI/LVP CAD-to-silicon alignment when 7 nm technology is implemented.

In this configuration, 10 (MP) gate interconnects 434 extend across the MOS standard fiducial cell IC 400 and thus across the first portion 402, the second portion 404, and the third portion 408. Each of the gate interconnects 434 is approximately 60.5 nm apart in the first direction. In one configuration, the M0 interconnects above the gate interconnects 434 reflect more or substantially more electromagnetic radiation/laser compared to the active regions 40AR1, 412, 414, 416, 418, 420, 422, 424, 426, and 40AR6 of the MOS standard fiducial cell IC 400 for detection during the LVI/LVP CAD-to-silicon alignment. Note that the M0 interconnects, which include the power rails 40PR1, 40PR2, 40PR3, 40PR4 are not connected to the active regions 40AR1, 40AR2, 40AR3, 40AR4, 40AR5, 40AR6. Thus, the active regions 40AR1, 40AR2, 40AR3, 40AR4, 40AR5, 40AR6 are disconnected from contacts and interconnects.

In one configuration, each of the active regions 412, 414, 416, 418, 420, 422, 424, 426 of the first portion 402, the second portion 404, and the third portion 408 of the MOS standard fiducial cell IC 400 may include at least one MOS fin field effect transistor (FinFET) and a plurality of fins associated with the at least one MOS FinFET. Also, in one configuration, the MOS standard fiducial cell IC 400 is a passive cell, which means the MOS standard fiducial cell IC 400 does not draw power from, or drain power to, the power rails 40PR1, 40PR2, 40PR3, 40PR4 since 40PR1, 40PR2, 40PR3, 40PR4 are not connected to the active regions 40AR1, 412, 414, 416, 418, 420, 422, 424, 426, and 40AR6, even though the MOS standard fiducial cell IC 400 is connected to the power rails 40PR1, 40PR2, 40PR3, 40PR4.

FIGS. 5A and 5B are example diagrams illustrating a plan views of an example MOS standard fiducial cell IC 500 including a first portion 502, a second portion 504, a third portion 508, and a fourth portion 510 formed on a p-type substrate 506 (e.g., silicon substrate). FIG. 5A illustrates active regions and gate interconnects of the MOS standard fiducial cell IC 500. FIG. 5B illustrates a M0 metal structure of the MOS standard fiducial cell IC 500 above the gate interconnects of FIG. 5A.

The MOS standard fiducial cell IC 500 may be four standard cell rows in height and 10 gate interconnect spacings in width. The MOS standard fiducial cell IC 500 may be a 7 nm standard cell. The MOS standard fiducial cell IC 500 includes five power rails 50PR1, 50PR2, 50PR3, 50PR4, 50PR5 each extending in a first direction. Additionally, there are eight sets of active regions 50AR1, 50AR2, 50AR3, 50AR4, 50AR5, 50AR6, 50AR7, 50AR5. This example is the tallest and narrowest of the MOS standard fiducial cells in that the MOS standard fiducial cell IC 500 is 10 placement grids wide and 4 standard cell rows tall. A second direction is orthogonal to the first direction so that the 50PR1, 50PR2, 50PR3, 50PR4, 50PR5 are each separated in the second direction by approximately 250 nm.

The power rail 50PR1 is configured to provide a negative supply voltage or a ground (e.g., Vss, ground) to the first portion 502 of the MOS standard fiducial cell IC 500. Furthermore, the set of active regions 50AR1 is adjacent to the power rail 50PR1. In this example, the set of active regions 50AR1 is formed as one continuous active region that extends in the first direction along the entire width of the MOS standard fiducial cell IC 500. More specifically, the power rail 50PR1 is adjacent to the one continuous active region 50AR1.

The power rail 50PR2 is configured to provide a positive supply voltage (e.g., Vdd) to the first portion 502 and the second portion 504 of the MOS standard fiducial cell IC 500. Furthermore, the set of active regions 50AR2 is adjacent to one side of the power rail 50PR2 and the set of active regions 50AR3 is adjacent to a second side of the power rail 50PR2. In this example, the set of active regions 50AR2 is formed as a two disjoint active regions 512, 514 on a first side of the power rail 50PR2. The two disjoint active regions 512, 514 are separated by less than 300 nm (e.g., approximately 277 nm). The active regions 512, 514 are collinear in the first direction and are each on distal sides of the IC, which are shown as the left side and the right side of the IC in FIG. 5A. More specifically, the active region 512 is on one side of the IC while the active region 514 is on the opposite side of the IC.

The set of active regions 50AR3 is also formed as a two disjoint active regions 516, 518 on the second side of the power rail 50PR2 opposite the first side. The two disjoint active regions 516, 518 are separated by less than 300 nm (e.g., approximately 277 nm). The active regions 516, 518 are collinear in the first direction. Furthermore, the two disjoint active regions 516, 518 are each on distal sides of the IC, which are shown as the left side and the right side of the IC in FIG. 5A. More specifically, the active region 516 is on one side of the IC while the active region 518 is on the opposite side of the IC.

The power rail 50PR3 is configured to provide a negative supply voltage or a ground (e.g., Vss, ground) to the second portion 504 and the third portion 508 of the MOS standard fiducial cell IC 500. Furthermore, the set of active regions 50AR4 is adjacent to one side of the power rail 50PR3 and the set of active regions 50AR5 is adjacent to a second side of the power rail 50PR3. In this example, the set of active regions 50AR4 is formed as a two disjoint active regions 520, 522 on a first side of the power rail 50PR3. The two disjoint active regions 520, 522 are separated by less than 300 nm (e.g., approximately 277 nm). The active regions 520, 522 are collinear in the first direction. Furthermore, the two disjoint active regions 520, 522 are each on distal sides of the IC, which are shown as the left side and the right side of the IC in FIG. 5A. More specifically, the active region 520 is on one side of the IC while the active region 522 is on the opposite side of the IC.

The set of active regions 50AR5 is also formed as a two disjoint active regions 524, 526 on the second side of the power rail 50PR3 opposite the first side. The two disjoint active regions 524, 526 are separated by less than 300 nm (e.g., approximately 277 nm). The active regions 524, 526 are collinear in the first direction. Furthermore, the two disjoint active regions 524, 526 are each on distal sides of the IC, which are shown as the left side and the right side of the IC in FIG. 5A. More specifically, the active region 524 is on one side of the IC while the active region 526 is on the opposite side of the IC.

The power rail 50PR4 is configured to provide a positive supply voltage (e.g., Vdd) to the third portion 508 and the fourth portion 510 of the MOS standard fiducial cell IC 500. Furthermore, the set of active regions 50AR6 is adjacent to one side of the power rail 50PR4 and the set of active regions 50AR7 is adjacent to a second side of the power rail 50PR4. In this example, the set of active regions 50AR6 is formed as two disjoint active regions 528, 530 on a first side of the power rail 50PR4. The two disjoint active regions 528, 530 are separated by less than 300 nm (e.g., approximately 277 nm). The active regions 528, 530 are collinear in the first direction and are each on distal sides of the IC, which are shown as the left side and the right side of the IC in FIG. 5A. More specifically, the active region 528 is on one side of the IC while the active region 530 is on the opposite side of the IC.

The set of active regions 50AR7 is also formed as a two disjoint active regions 532, 534 on the second side of the power rail 50PR4 opposite the first side. The two disjoint active regions 532, 534 are separated by less than 300 nm (e.g., approximately 277 nm). The active regions 532, 534 are collinear in the first direction. Furthermore, the two disjoint active regions 532, 534 are each on distal sides of the IC, which are shown as the left side and the right side of the IC in FIG. 5A. More specifically, the active region 532 is on one side of the IC while the active region 534 is on the opposite side of the IC.

The power rail 50PR5 is configured to provide a negative supply voltage or a ground (e.g., Vss, ground) to the fourth portion 510 of the MOS standard fiducial cell IC 500. Furthermore, the set of active regions 50AR8 is adjacent to the power rail 50PR5. In this example, the set of active regions 50AR8 is formed as one continuous active region that extends in the first direction along the entire width of the MOS standard fiducial cell IC 500. More specifically, the power rail 50PR5 is adjacent to the one continuous active region.

As shown in FIG. 5A, each of the active regions 512, 516, 520, 524, 528, 532 are aligned in the second direction and each of the active regions 514, 518, 522, 526, 530, 534 are aligned in the second direction. Furthermore, the region of the p-type substrate 506 between the active regions 512 and 514, active regions 516 and 518, active regions 520 and 522, active regions 524 and 526, 528 and 530, 532 and 534, between the active region 50AR1 and the power rail 50PR2, between the power rail 50PR2 and the power rail 50PR3, between the power rail 50PR3 and the power rail 50PR4, and between the power rail 50PR4 and the active region 50AR8 are inactive regions 538, 540, 542, 544 of the first portion 502, the second portion 504, the third portion 508, and the fourth portion 510 respectively. Thus, the inactive regions 538, 540, 542, 544 may be used to electrically isolate adjacent active regions within MOS standard fiducial cell IC 500 and/or to electrically isolate adjacent standard cell devices from each other. M0 interconnects (See FIG. 5B) that extend in the first direction reflect more or substantially more electromagnetic radiation/laser beam compared to the active regions 50AR1, 512, 514, 516, 518, 520, 522, 524, 526, 528, 530, 532, 534, 50AR8, and the inactive regions 538, 540, 542, 544 allow for that electromagnetic radiation to pass through and be reflected by the M0 interconnects.

Given that the first portion 502, second portion, 504, third portion 508, and the fourth portion 510 are all adjacent relative to the second direction so that the MOS standard fiducial cell IC 500 has a height of approximately 960 nm, the inactive regions 538, 540, 542, 544 in combination with the spacing between the disjointed set of active regions 50AR2, 50AR3, 50AR4, 50AR5, 50AR6, 50AR7 allow enough electromagnetic radiation to be reflected off the M0 interconnects for detection during the LVI/LVP CAD-to-silicon alignment when 7 nm technology is implemented.

In this configuration, 10 (MP) gate interconnects 546 extend across the MOS standard fiducial cell IC 500 and thus across the first portion 502, the second portion 504, the third portion 508, and the fourth portion 510. Each of the gate interconnects 546 is approximately 60.5 nm apart in the first direction. In one configuration, the M0 interconnects (See FIG. 5B) above the 10 MP gate interconnects 546 reflect more or substantially more electromagnetic radiation/laser beam compared to the active regions 50AR1, 512, 514, 516, 518, 520, 522, 524, 526, 528, 530, 532, 534, and 50AR8 of the MOS standard fiducial cell IC 500 for detection during the LVI/LVP CAD-to-silicon alignment. Note that the M0 interconnects, which include the power rails 50PR1, 50PR2, 50PR3, 50PR4, 50PR5 are not connected to the active regions 50AR1, 50AR2, 50AR3, 50AR4, 50AR5, 50AR6, 50AR7, 50AR8. Thus, the active regions 50AR1, 50AR2, 50AR3, 50AR4, 50AR5, 50AR6, 50AR7, 50AR8 are disconnected from contacts and interconnects.

In one configuration, each of the active regions 512, 514, 516, 518, 520, 522, 524, 526, 528, 530, 532, 534 of the first portion 502, the second portion 504, the third portion 508, and fourth portion 510 of the MOS standard fiducial cell IC 500 may include at least one MOS fin field effect transistor (FinFET) and a plurality of fins associated with the at least one MOS FinFET. Also, in one configuration, the MOS standard fiducial cell IC 500 is a passive cell, which means the MOS standard fiducial cell IC 500 does not draw power from, or drain power to, the power rails 50PR1, 50PR2, 50PR3, 50PR4, 50PR5 since 50PR1, 50PR2, 50PR3, 50PR4, 50PR5 are not connected to the active regions 50AR1, 512, 514, 516, 518, 520, 522, 524, 526, 528, 530, 532, 534, 50AR8.

FIGS. 6A and 6B are example diagrams illustrating a plan views of an example MOS standard fiducial cell IC 600 including a first portion 602, a second portion 604, and a third portion 608, formed on a p-type substrate 606 (e.g., silicon substrate). FIG. 6A illustrates active regions and gate interconnects of the MOS standard fiducial cell IC 600. FIG. 6B illustrates a M0 metal structure of the MOS standard fiducial cell IC 600 above the gate interconnects of FIG. 6A.

The MOS standard fiducial cell IC 600 may be three cell rows in height and 17 gate spacings across. The MOS standard fiducial cell IC 600 may be a 7 nm standard cell. The MOS standard fiducial cell IC 600 includes four power rails 60PR1, 60PR2, 60PR3, 60PR4 each extending in a first direction. Additionally, there are six sets of active regions 60AR1, 60AR2, 60AR3, 60AR4, 60AR5, 60AR6. This example is the shortest and widest of the MOS standard fiducial cells in that the MOS standard fiducial cell IC 600 is 17 placement grids wide and 3 standard cell rows tall. A second direction is orthogonal to the first direction so that the 60PR1, 60PR2, 60PR3, 60PR4 are each separated in the second direction by approximately 250 nm.

The power rail 60PR1 is configured to provide a negative supply voltage or a ground (e.g., Vss, ground) to the first portion 602 of the MOS standard fiducial cell IC 600. Furthermore, the set of active regions 60AR1 is adjacent to the power rail 60PR1. In this example, the set of active regions 60AR1 is formed as one continuous active region that extends in the first direction along the entire width of the MOS standard fiducial cell IC 600. More specifically, the power rail 60PR1 is adjacent to the one continuous active region 60AR1.

The power rail 60PR2 is configured to provide a positive supply voltage (e.g., Vdd) to the first portion 602 and the second portion 604 of the MOS standard fiducial cell IC 600. Furthermore, the set of active regions 60AR2 is adjacent to one side of the power rail 60PR2 and the set of active regions 60AR3 is adjacent to a second side of the power rail 60PR2. In this example, the set of active regions 60AR2 is formed as three disjoint active regions 612, 613, 614 on a first side of the power rail 60PR2. The three disjoint active regions 612, 613, 614 are separated by less than 300 nm (e.g., approximately 277 nm). The active regions 612, 613, 614 are collinear in the first direction. The active regions 612, 614 are each on distal sides of the IC, which are shown as the left side and the right side of the IC in FIG. 6A. More specifically, the active region 612 is on one side of the IC while the active region 614 is on the opposite side of the IC. The active region 613 is in a central portion between the left side and the right side and thus between the active regions 612, 614.

The set of active regions 60AR3 is also formed as a three disjoint active regions 616, 617, 618 on the second side of the power rail 60PR2 opposite the first side. The three disjoint active regions 616, 617, 618 are separated by less than 300 nm (e.g., approximately 277 nm). The active regions 616, 617, 618 are collinear in the first direction. The active regions 616, 618 are each on distal sides of the IC, which are shown as the left side and the right side of the IC in FIG. 6A. More specifically, the active region 616 is on one side of the IC while the active region 618 is on the opposite side of the IC. The active region 617 is in a central portion between the left side and the right side and thus between the active regions 616, 618.

The power rail 60PR3 is configured to provide a negative supply voltage or a ground (e.g., Vss, ground) to the second portion 604 and the third portion 608 of the MOS standard fiducial cell IC 600. Furthermore, the set of active regions 60AR4 is adjacent to one side of the power rail 60PR3 and the set of active regions 60AR5 is adjacent to a second side of the power rail 60PR3. In this example, the set of active regions 60AR4 is formed as three disjoint active regions 620, 621, 622 on a first side of the power rail 60PR3. The three disjoint active regions 620, 621, 622 are separated by less than 300 nm (e.g., approximately 277 nm). The active regions 620, 621, 622 are collinear in the first direction. The active regions 620, 622 are each on distal sides of the IC, which are shown as the left side and the right side of the IC in FIG. 6A. More specifically, the active region 620 is on one side of the IC while the active region 622 is on the opposite side of the IC. The active region 621 is in a central portion between the left side and the right side and thus between the active regions 620, 622.

The set of active regions 60AR5 is also formed as a three disjoint active regions 624, 625, 626 on the second side of the power rail 60PR3 opposite the first side. The three disjoint active regions 624, 625, 626 are separated by less than 300 nm (e.g., approximately 277 nm). The active regions 624, 625, 626 are collinear in the first direction. The active regions 624, 626 are each on distal sides of the IC, which are shown as the left side and the right side of the IC in FIG. 6A. More specifically, the active region 624 is on one side of the IC while the active region 626 is on the opposite side of the IC. The active region 625 is in a central portion between the left side and the right side and thus between the active regions 624, 626.

The power rail 60PR4 is configured to provide a positive supply voltage (e.g., Vdd) to the third portion 608 of the MOS standard fiducial cell IC 600. Furthermore, the set of active regions 60AR6 is adjacent to the power rail 60PR4. In this example, the set of active regions 60AR6 is formed as one continuous active region that extends in the first direction along the entire width of the MOS standard fiducial cell IC 600. More specifically, the power rail 60PR4 is adjacent to the one continuous active region.

As shown in FIG. 6A, each of the active regions 612, 616, 620, 624 are aligned in the second direction, each of active regions 613, 617, 621, 625, and each of the active regions 614, 618, 622, 626 are aligned in the second direction. Furthermore, the region of the p-type substrate 606 between the active regions 612 and 613, active regions 613 and 614, active regions 616 and 617, active regions 617 and 618, active regions 620 and 621, active regions 621 and 622, active regions 624 and 625, active regions 625 and 626, between the active region 60AR1 and the power rail 60PR2, between the power rail 60PR2 and the power rail 60PR3, and between the power rail 60PR3 and the active region 60AR6, are inactive regions 628, 630, 632 of the first portion 602, the second portion 604, and the third portion 608, respectively. Thus, the inactive regions 628, 630, 632 may be used to electrically isolate adjacent active regions within MOS standard fiducial cell IC 600 and/or to electrically isolate adjacent standard cell devices from each other. The M0 interconnects (See FIG. 6B) that extend in the first direction reflect more or substantially more electromagnetic radiation/laser beam compared to the active regions 60AR1, 612, 613, 614, 616, 617, 618, 620, 621, 622, 624, 625, 626, 60AR6, and the inactive regions 628, 630, 632 allow for that electromagnetic radiation to pass through and be reflected by the M0 interconnects (See FIG. 6B). Given that the first portion 602, second portion, 604, and third portion 608 are all adjacent relative to the second direction so that the MOS standard fiducial cell IC 600 has a height of approximately 820 nm, the inactive regions 628, 630, 632 in combination with the spacing between the disjointed set of active regions 60AR2, 60AR3, 60AR4, 60AR5 allow enough electromagnetic radiation to be reflected off the M0 interconnects during the LVI/LVP CAD-to-silicon alignment when 7 nm technology is implemented.

In this configuration, 17 (MP) gate interconnects 634 extend across the MOS standard fiducial cell IC 600 and thus across the first portion 602, the second portion 604, and the third portion 608. Each of the gate interconnects 634 is approximately 60.5 nm apart in the first direction. In one configuration, the M0 interconnects above the 17 gate interconnects 634 reflect more or substantially more electromagnetic radiation/laser compared to the active regions 60AR1, 612, 613, 614, 616, 617, 618, 620, 621, 622, 624, 625, 626, and 60AR6 of the MOS standard fiducial cell IC 600 for detection during the LVI/LVP CAD-to-silicon alignment. Note that the M0 interconnects, which include the power rails 60PR1, 60PR2, 60PR3, 60PR4 are not connected to the active regions 60AR1, 60AR2, 60AR3, 60AR4, 60AR5, 60AR6. Thus, the active regions 60AR1, 60AR2, 60AR3, 60AR4, 60AR5, 60AR6 are disconnected from contacts and interconnects.

In one configuration, each of the active regions 612, 613, 614, 616, 617, 618, 620, 621, 622, 624, 625, 626 of the first portion 602, the second portion 604, and the third portion 608 of the MOS standard fiducial cell IC 600 may include at least one MOS fin field effect transistor (FinFET) and a plurality of fins associated with the at least one MOS FinFET. Also, in one configuration, the MOS standard fiducial cell IC 600 is a passive cell, which means MOS standard fiducial cell IC 600 does not draw power from, or drain power to, the power rails 60PR1, 60PR2, 60PR3, 60PR4 since the 60PR1, 60PR2, 60PR3, 60PR4 are not connected to the active regions 60AR1, 612, 613, 614, 616, 617, 618, 620, 621, 622, 624, 625, 626, 60AR6.

FIGS. 7A and 7B are example diagrams illustrating a plan views of an example MOS standard fiducial cell IC 700 including a first portion 702, a second portion 704, a third portion 708, and a fourth portion 510 formed on a p-type substrate 706 (e.g., silicon substrate). FIG. 7A illustrates active regions and gate interconnects of the MOS standard fiducial cell IC 700. FIG. 5B illustrates a M0 metal structure of the MOS standard fiducial cell IC 700 above the gate interconnects of FIG. 7A.

The MOS standard fiducial cell IC 700 may be four standard cell rows in height and 17 gate interconnect spacings in width. The MOS standard fiducial cell IC 700 may be a 7 nm standard cell. The MOS standard fiducial cell IC 700 includes five power rails 70PR1, 70PR2, 70PR3, 70PR4, 70PR5 each extending in a first direction. Additionally, there are eight sets of active regions 70AR1, 70AR2, 70AR3, 70AR4, 70AR5, 70AR6, 70AR7, 70AR8. This example is the tallest and widest of the MOS standard fiducial cells in that the MOS standard fiducial cell IC 700 is 17 placement grids wide and 4 standard cell rows tall. A second direction is orthogonal to the first direction so that the 70PR1, 70PR2, 70PR3, 70PR4, 70PR5 are each separated in the second direction by approximately 270 nm.

The power rail 70PR1 is configured to provide a negative supply voltage or a ground (e.g., Vss, ground) to the first portion 702 of the MOS standard fiducial cell IC 700. Furthermore, the set of active regions 70AR1 is adjacent to the power rail 70PR1. In this example, the set of active regions 70AR1 is formed as one continuous active region that extends in the first direction along the entire width of the MOS standard fiducial cell IC 700. More specifically, the power rail 70PR1 is adjacent to the one continuous active region 70AR1.

The power rail 70PR2 is configured to provide a positive supply voltage (e.g., Vdd) to the first portion 702 and the second portion 704 of the MOS standard fiducial cell IC 700. Furthermore, the set of active regions 70AR2 is adjacent to one side of the power rail 70PR2 and the set of active regions 70AR3 is adjacent to a second side of the power rail 70PR2. In this example, the set of active regions 70AR2 is formed as three disjoint active regions 712, 713, 714 on a first side of the power rail 70PR2. The three disjoint active regions 712, 713, 714 are separated by less than 300 nm (e.g., approximately 277 nm). The active regions 712, 713, 714 are collinear in the first direction. The active regions 712, 714 are each on distal sides of the IC, which are shown as the left side and the right side of the IC in FIG. 7A. More specifically, the active region 712 is on one side of the IC while the active region 714 is on the opposite side of the IC. The active region 713 is in a central portion between the left side and the right side and thus between the active regions 712, 714.

The set of active regions 70AR3 is also formed as a three disjoint active regions 716, 718 on the second side of the power rail 70PR2 opposite the first side. The three disjoint active regions 716, 717, 718 are separated by less than 300 nm (e.g., approximately 277 nm). The active regions 716, 717, 718 are collinear in the first direction. The active regions 716, 718 are each on distal sides of the IC, which are shown as the left side and the right side of the IC in FIG. 7A. More specifically, the active region 716 is on one side of the IC while the active region 718 is on the opposite side of the IC. The active region 717 is in a central portion between the left side and the right side and thus between the active regions 716, 718.

The power rail 70PR3 is configured to provide a negative supply voltage or a ground (e.g., Vss, ground) to the second portion 704 and the third portion 708 of the MOS standard fiducial cell IC 700. Furthermore, the set of active regions 70AR4 is adjacent to one side of the power rail 70PR3 and the set of active regions 70AR5 is adjacent to a second side of the power rail 70PR3. In this example, the set of active regions 70AR4 is formed as three disjoint active regions 720, 721, 722 on a first side of the power rail 70PR3. The three disjoint active regions 720, 721, 722 are separated by less than 300 nm (e.g., approximately 277 nm). The active regions 720, 721, 722 are collinear in the first direction. The active regions 720, 722 are each on distal sides of the IC, which are shown as the left side and the right side of the IC in FIG. 7A. More specifically, the active region 720 is on one side of the IC while the active region 722 is on the opposite side of the IC. The active region 721 is in a central portion between the left side and the right side and thus between the active regions 720, 722.

The set of active regions 70AR5 is also formed as a three disjoint active regions 724, 725, 726 on the second side of the power rail 70PR3 opposite the first side. The three disjoint active regions 724, 725, 726 are separated by less than 300 nm (e.g., approximately 277 nm). The active regions 724, 725, 726 are collinear in the first direction. The active regions 724, 726 are each on distal sides of the IC, which are shown as the left side and the right side of the IC in FIG. 7A. More specifically, the active region 724 is on one side of the IC while the active region 726 is on the opposite side of the IC. The active region 725 is in a central portion between the left side and the right side and thus between the active regions 724, 726.

The power rail 70PR4 is configured to provide a positive supply voltage (e.g., Vdd) to the third portion 708 and the fourth portion 710 of the MOS standard fiducial cell IC 700. Furthermore, the set of active regions 70AR6 is adjacent to one side of the power rail 70PR4 and the set of active regions 70AR7 is adjacent to a second side of the power rail 70PR4. In this example, the set of active regions 70AR6 is formed as three disjoint active regions 728, 729, 730 on a first side of the power rail 70PR4. The three disjoint active regions 728, 729, 730 are separated by less than 300 nm (e.g., approximately 277 nm). The active regions 728, 729, 730 are collinear in the first direction. The active regions 728, 730 are each on distal sides of the IC, which are shown as the left side and the right side of the IC in FIG. 7A. More specifically, the active region 728 is on one side of the IC while the active region 730 is on the opposite side of the IC. The active region 729 is in a central portion between the left side and the right side and thus between the active regions 728, 730.

The set of active regions 70AR7 is also formed as three disjoint active regions 732, 733, 734 on the second side of the power rail 70PR4 opposite the first side. The three disjoint active regions 732, 733, 734 are separated by less than 300 nm (e.g., approximately 277 nm). The active regions 732, 733, 734 are collinear in the first direction. The active regions 732, 734 are each on distal sides of the IC, which are shown as the left side and the right side of the IC in FIG. 7A. More specifically, the active region 732 is on one side of the IC while the active region 734 is on the opposite side of the IC. The active region 733 is in a central portion between the left side and the right side and thus between the active regions 732, 734.

The power rail 70PR5 is configured to provide a negative supply voltage or a ground (e.g., Vss, ground) to the fourth portion 710 of the MOS standard fiducial cell IC 700. Furthermore, the set of active regions 70AR8 is adjacent to the power rail 70PR5. In this example, the set of active regions 70AR8 is formed as one continuous active region that extends in the first direction along the entire width of the MOS standard fiducial cell IC 700. More specifically, the power rail 70PR5 is adjacent to the one continuous active region.

As shown in FIG. 7A, each of the active regions 712, 716, 720, 724, 728, 732 are aligned in the second direction, each of the active regions 713, 717, 721, 725, 729, 733 are aligned in the second direction, and each of the active regions 714, 718, 722, 726, 730, 734 are aligned in the second direction. Furthermore, the region of the p-type substrate 706 between the active regions 712 and 713, active regions 713 and 714, active regions 716 and 717, active regions 717 and 718, active regions 720 and 721, active regions 721 and 722, active regions 724 and 725, active regions 725 and 726, active regions 728 and 729, active regions 729 and 730, active regions 732 and 733, active regions 733 and 734, between the active region 70AR1 and the power rail 70PR2, between the power rail 70PR2 and the power rail 70PR3, between the power rail PR3 and the power rail PR4 and between the power rail 70PR4 and the active region 70AR8, are inactive regions 738, 740, 742, 744 of the first portion 702, the second portion 704, the third portion 708, and fourth portion 710 respectively. Thus, the inactive regions 738, 740, 742, 744 may be used to electrically isolate adjacent active regions within MOS standard fiducial cell IC 700 and/or to electrically isolate adjacent standard cell devices from each other. The M0 interconnects (See FIG. 7B) extending in the first direction reflect more or substantially more electromagnetic radiation/laser beam compared to the active regions 70AR1, 712, 713, 714, 716, 717, 718, 720, 721, 722, 724, 725, 726, 728, 729, 730, 732, 733, 734, 70AR8, and the inactive regions 738, 740, 742, 744 allow for that electromagnetic radiation to pass through and be reflected by the M0 interconnects (See FIG. 7B). Given that the first portion 702, second portion, 704, third portion 708, and the fourth portion 710 are all adjacent relative to the second direction so that the MOS standard fiducial cell IC 700 has a height of approximately 960 nm, the inactive regions 738, 740, 742, 744 in combination with the spacing between the disjointed set of active regions 70AR2, 70AR3, 70AR4, 70AR5, 70AR6, 70AR7 allow enough electromagnetic radiation to be reflected off the M0 interconnects for detection during the LVI/LVP CAD-to-silicon alignment when 7 nm technology is implemented.

In this configuration, 17 (MP) gate interconnects 746 extend across the MOS standard fiducial cell IC 700 and thus across the first portion 702, the second portion 704, the third portion 708, and the fourth portion 710. Each of the gate interconnects 746 is approximately 60.5 nm apart in the first direction. In one configuration, the M0 interconnects (See FIG. 7B) above the 17 MP gate interconnects 746 reflect more or substantially more electromagnetic radiation/laser compared to the active regions 70AR1, 712, 713, 714, 716, 717, 718, 720, 721, 722, 724, 725, 726, 728, 729, 730, 732, 733, 734, and 70AR8, of the MOS standard fiducial cell IC 700 for detection during the LVI/LVP CAD-to-silicon alignment. Note that the M0 interconnects, which include the power rails 70PR1, 70PR2, 70PR3, 70PR4, 70PR5 are not connected to the active regions 70AR1, 70AR2, 70AR3, 70AR4, 70AR5, 70AR6, 70AR7, 70AR8. Thus, the active regions 70AR1, 70AR2, 70AR3, 70AR4, 70AR5, 70AR6, 70AR7, 70AR8 are disconnected from contacts and interconnects.

In one configuration, each of the active regions 712, 713, 714, 716, 717, 718, 720, 721, 722, 724, 725, 726, 728, 729, 730, 732, 733, 734 of the first portion 702, the second portion 704, the third portion 708, and fourth portion 710 of the MOS standard fiducial cell IC 700 may include at least one MOS fin field effect transistor (FinFET) and a plurality of fins associated with the at least one MOS FinFET. Also, in one configuration, the MOS standard fiducial cell IC 700 is a passive cell, which means the MOS standard fiducial cell IC 700 does not draw power from, or drain power to, the power rails 70PR1, 70PR2, 70PR3, 70PR4, 70PR5, as the M0 structure in FIG. 7B is disconnected from the active regions 70AR1, 712, 713, 714, 716, 717, 718, 720, 721, 722, 724, 725, 726, 728, 729, 730, 732, 733, 734, 70AR8 in FIG. 7A.

The 4 types of MOS standard fiducial cell ICs 400, 500, 600, 700 are distributed throughout the standard cells in an IC so as to facilitate the identification of MOS standard fiducial cells in the IC and to allow alignment between the LVM image of the IC and the CAD layer of the IC. By aligning the physical image of the IC with the CAD representation (e.g., CAD-to-silicon alignment), testing can be done on an IC design.

The perceived opening in the diffusion is slightly different for each type of MOS standard fiducial cells 400, 500, 600, 700. Since the MOS standard fiducial cell 700 is the largest, the MOS standard fiducial cell IC 700 is the easiest to perceive (e.g., most visible) by a human operator, which enables the human operator to perform the CAD-to-silicon alignment more rapidly. However, although the MOS standard fiducial cells 400, 500, 600 are more difficult to perceive (e.g., less visible) than the MOS standard fiducial cell IC 700, their variance in visibility aids in the identification of unique patterns of fiducial cells during CAD-to-silicon alignment. Through experimentation, it has been determined that the largest MOS standard fiducial cell IC 700 should receive the most frequent placement throughout an IC, while the other MOS standard fiducial cell ICs 400, 500, 600 should also receive some placement in order to obtain the unique patterns that further aid in identification and alignment. The table below illustrates an exemplary target utilization for the four types of MOS standard fiducial cell ICs 400, 500, 600, 700, which was determined experimentally to be more efficient for CAD-to-silicon in 7 nm process technology.

| Fiducial Type | Fiducial Cell Size | Target Utilization |
| --- | --- | --- |
| 10X3 (400 in FIG. 4) | Smallest of the four cells | 5% |
| 10X4 (500 in FIG. 5) | Not as wide as the largest cell | 15% |
| 17X3 (600 in FIG. 6) | Not as tall as the largest cell | 5% |
| 17X4 (700 in FIG. 7) | Largest cell | 75% |
| Total Utilization | n/a | 100% |

The MOS standard fiducial cells may be placed to minimize the total number of the MOS standard fiducial cells within an IC to reduce IC area consumption by the fiducial cells. In one aspect, the impact of the MOS standard fiducial cells on the chip area utilization of an IC is desired to be less than 0.1%. On the other hand, the MOS standard fiducial cells are made large enough to appear as an opening in the diffusion to facilitate identification and alignment. Also, a sufficient number of MOS standard fiducial cells are placed to ensure that for most viewing aperture positions, at least two of the MOS standard fiducial cells are simultaneously viewable within each window viewable by a human operator during the CAD-to-silicon alignment. In one example, each window is a 50 um×50 um window seen by the human operator during the CAD-to-silicon alignment phase. In one aspect, the number of MOS standard fiducial cells viewable within the 50 um×50 um window may be 4. The four types of fiducial cells may be mixed and placed in a non-uniform pattern to create unique patterns in the openings in the diffusion of the non-fiducial standard cells to facilitate the CAD-to-silicon alignment.

Figure 8:
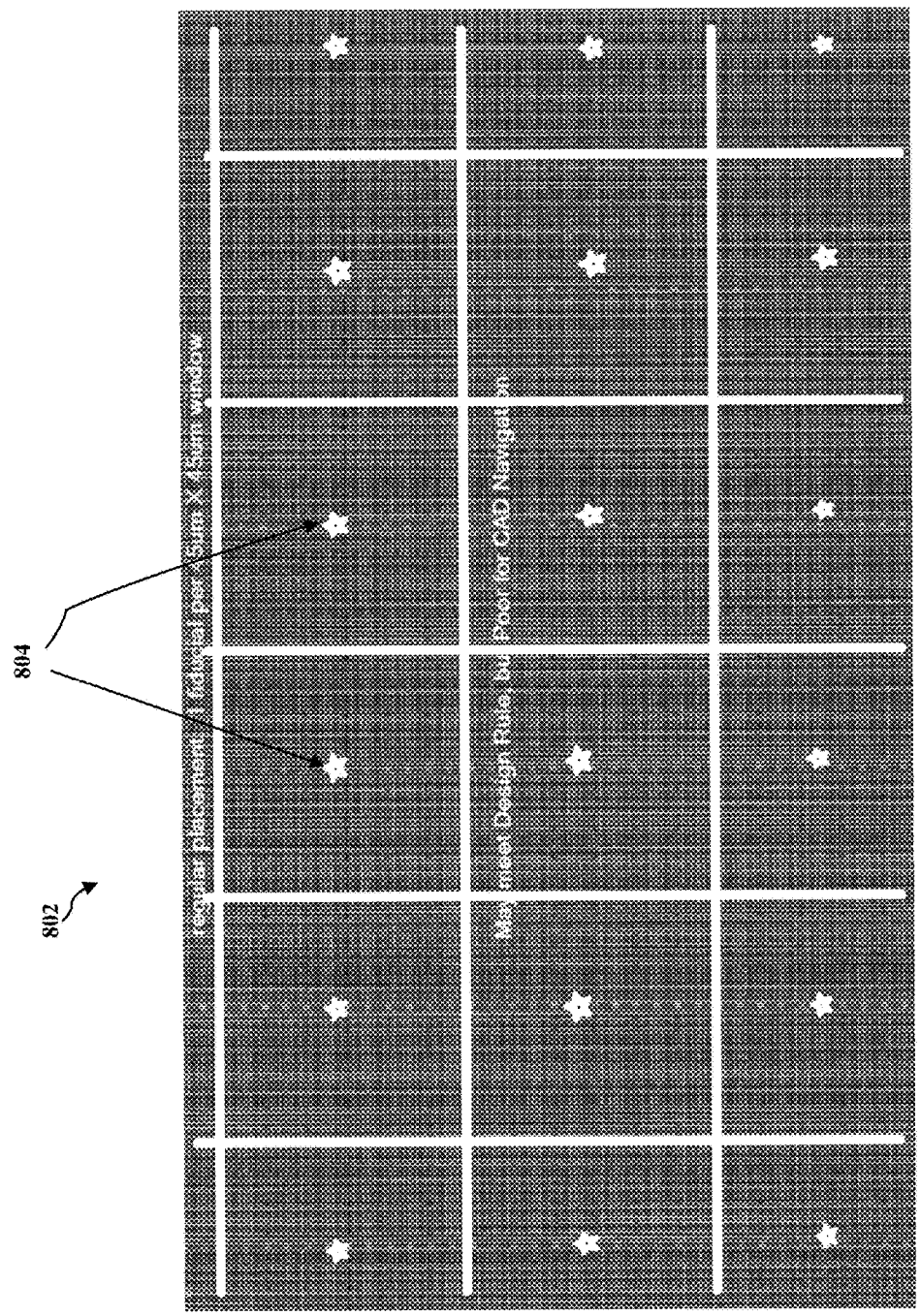
FIG. 8 illustrates a typical placement of the MOS standard fiducial cells within an IC layout by an apparatus implementing a CAD placement tool.

FIG. 8 illustrates a typical placement 802 of the MOS standard fiducial cells 804 within an IC layout by an apparatus implementing a CAD placement tool. As shown in FIG. 8, the MOS standard fiducial cells are arranged on a grid with neighboring MOS standard fiducial cells no more than 45 um apart in the x-direction (horizontal direction) and no more than 45 um apart in Y-direction (vertical direction). This ensures that for most aperture positions at least two MOS standard fiducial cells are viewable for each 50 um×50 um window. Consequently, the windows defined by the grid shown in FIG. 8 are 45 um×45 um windows, having a MOS standard fiducial cell placed at the center of each 45 um×45 um window of the grid.

However, the current alignment is not optimal for CAD-to-silicon navigation on the apparatus by a human operator. Instead, some misalignment of MOS standard fiducial cells that creates a unique placement pattern may make it easier for a human operator to recognize and align the CAD representation of the chip layout with the laser scanned image of the silicon chip. This enables the human operator to navigate the LSM image more rapidly to align with the CAD representation and align more rapidly, thereby decreasing the amount of time needed to test physical chips.

Accordingly, in some implementations, the apparatus may implement a placement tool that adjusts the placement of the MOS standard fiducial cells with some random variation within acceptable distance limits from the placement shown in FIG. 8 to create a unique placement pattern that is more easily recognizable by a human operator. More specifically, a dither is introduced in the x-positions and the y-positions when placing the MOS standard fiducial cells. The "dither" is an intentionally applied form of offset from the global grid positions of FIG. 8 used for the constrained randomization of the XY-position of LVP fiducial standard cells into the IC layout.

Figure 9:
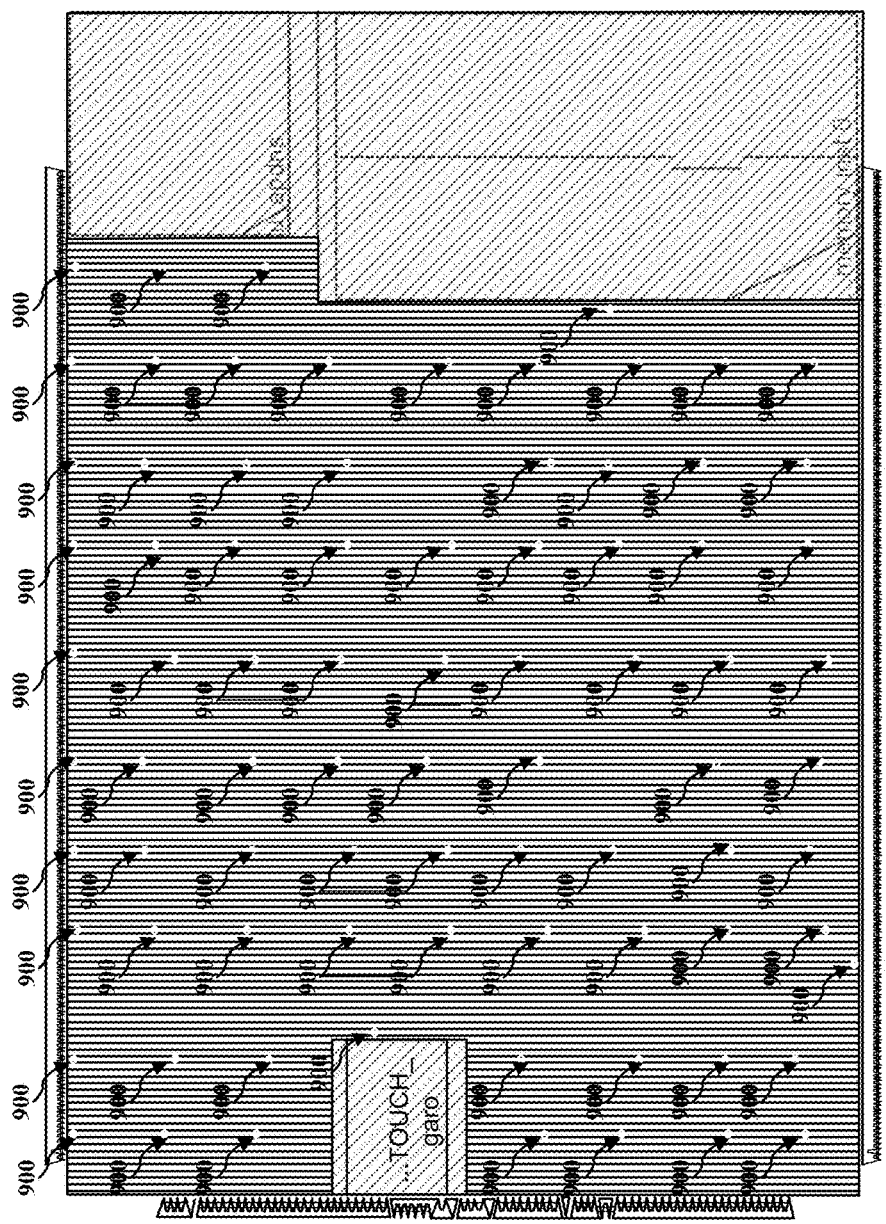
FIG. 9 illustrates one example of the placement of MOS standard fiducial cells in an IC with dithering in the x-direction and the y-direction.

FIG. 9 illustrates one example of the placement of MOS standard fiducial cells in an IC. The placement indicators 900 illustrate the location of placement by a placement apparatus of each of the MOS standard fiducial cells in an IC layout. To implement the placement, the apparatus may define a region (in um) that is to be populated with MOS standard fiducial cells. In the implementation shown in FIG. 9, the region of the placement indicators 900 is defined as:
 x_start=100.0;
 x_end=500.0;
 y_start=200.0;
 y_end=700.0;

For example, x_start may define a starting location in the horizontal x direction for the region while x_end may define an ending location in the horizontal x direction of the region. Thus, the region has a range in the horizontal x direction from 100.0 um to 500.0 um in the horizontal x direction and thus the region is 400.0 um in length in the horizontal x direction. Also, y_start may define a starting location in the vertical y direction for the region while y_end may define an ending location in the vertical y direction of the region. Thus, the region has a range in the vertical y direction from 200.0 um to 700.0 um in the vertical y direction and thus the region is 500.0 um in height in the vertical y direction.

To ensure that at least two MOS standard fiducial cells are visible in every 50 um×50 um viewing window or aperture, a rule is implemented so that the maximum distance (in um) between a MOS standard fiducial cell and any standard cell is not greater than 45 um/2 in both the x direction and the y direction. More specifically,
 x_fid_des_rule=22.5;
 y_fid_des_rule=22.5;

A maximum range (in um) of random dither is applied to the x direction and the y direction that defines the maximum distance which the placement of a MOS standard fiducial cell in a 45 um×45 um grid can dither in the x direction and the y direction. In this case, the maximum dither in both the x direction and the y direction is equal to 2.0 um. More specifically,
 x_dither_range=2.0;
 y_dither_range=2.0;

Accordingly, in order to comply with the maximum distance rule in the x-direction and the y-direction while allowing the dither ranges defined above, half of the step size for placement of the MOS standard fiducial cell is defined in the x direction and the y directions as:
 x_step=x_fid_des_rule−x_dither_range;
 y_step=y_fid_des_rule−y_dither_range;

In order to implement nested loops that place the MOS standard fiducial cells, the maximum number of steps in the x-direction and the number of steps in the y-direction are determined given the one half step sizes as:
 x_max_steps=int ((x_end−x_start)/(2*x_step));
 y_max_steps=int ((y_end−y_start)/(2*y_step));

Two random double-precision floating point seed numbers are then generated between 0.0000 and 1.0000 based on the current time as:
 x_rand_seed=@based_on_current_time; sleep 1;
 y_rand_seed=@based_on_current_time;

These seed number will be unique based on the current time and thus provide the seed for generating the random dither for placement of the MOS standard fiducial cells. Using i as the index for the x direction and j for the index in the y direction, nested loops can be set up as follows:
 for i=0 to (x_max_steps−1)
  for j=0 to (y_max_steps−1)
   x_dither=(x_rand(x_rand_seed)−0.5)*x_dither_range);
   y_dither=(y_rand(y_rand_seed)−0.5)*y_dither_range);
   X=(x_start+x_step)+(2*i*x_step)+x_dither;
   Y=(y_start+y_step)+(2*j*y_step)+y_dither;
  end j
 end i Note that the random seed numbers in the x-direction and in the y-direction are used to generate random numbers for the x-direction and the y direction between 0 to 1. The random numbers are adjusted to be in the range between −0.5 and 0.5 by subtracting 0.5. The readjusted random numbers are then converted into a random dither distance in the x-direction and the y-direction by multiplication by the maximum dither ranges in the x-direction and the y-direction. The random dither distance is therefore in the range between (−0.5*x_dither_range) and (0.5*x_dither_range) in the x-direction and between (−0.5*y_dither_range) and (0.5*y_dither_range) in the y-direction. The starting location without the dither in the x-direction is initialized at (x_start+x_step) and in the y-direction as (y_start+y_step), thereby placing the starting location near the center of the starting 45 um×45 um grid. The x-dither and the y-dither are then added and the MOS standard fiducial cell is placed. For the next 45 um×45 um grid, the iterative loop steps the center of the starting 45 um×45 um grid by 2*i*x_step in the x-direction since the x_step is one half the step size in the x-direction and by 2*j*y_step in the y-direction since y_step is one half the step size in the y-direction, where the y-loop is nested in the x loop. In this manner, the apparatus generates the pattern for placement of the MOS standard fiducial cells shown in FIG. 9.

The placement of MOS standard fiducial cells use multiple LVP fiducial designs such as those described in FIGS. 4A-7B above. As described by the table above, the different LVP fiducial designs may have non-equal distribution in an IC layout (e.g., 75%, 5%, 15%, and 5%). It is desirable that a placement pattern is equally effective in X- and Y-dimensions at providing multiple fiducial cells viewable within each viewing window, such as the 50 um×50 um viewing window.

Figure 10A:
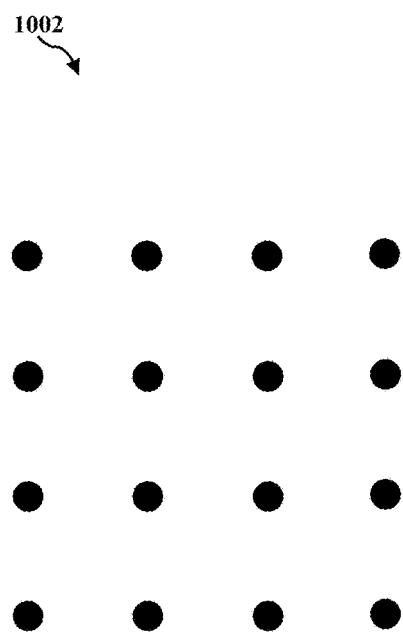
FIG. 10A-10D illustrate different exemplary placement patterns for MOS standard fiducial cells within an IC.

FIG. 10A illustrates an exemplary placement pattern 1002 for the MOS standard fiducial cells. The placement pattern shown in FIG. 10A is the starting placement pattern utilized to produce the pattern shown in FIG. 9. Dithering is applied to the x-positions and y-positions of the pattern shown in FIG. 10A so that the MOS standard fiducial cells are placed once dithering has been applied to the pattern. As shown in FIG. 10A, each MOS standard fiducial cell has eight neighbors in a square pattern. Other patterns however may be used.

Figure 10B:
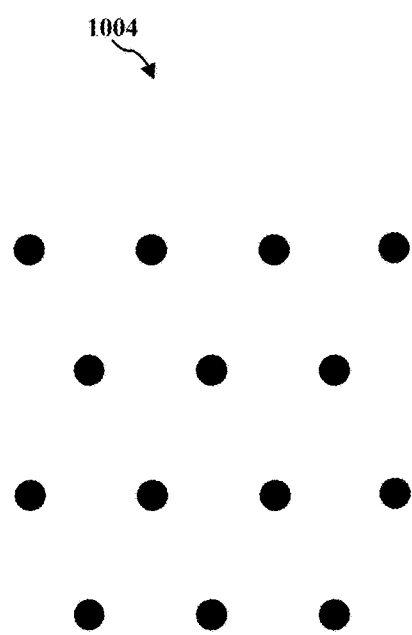

FIG. 10B illustrates another exemplary placement pattern 1004 for the MOS standard fiducial cells. The placement pattern shown in FIG. 10B is a square pattern, such as the pattern of FIG. 10A, with a 45-degree rotation. Dithering is applied to the x-positions and y-positions of the pattern shown in FIG. 10B so that the MOS standard fiducial cells are placed once dithering has been applied to the pattern. As shown in FIG. 10B, each MOS standard fiducial cell has four symmetrically positioned neighbors.

Figure 10C:
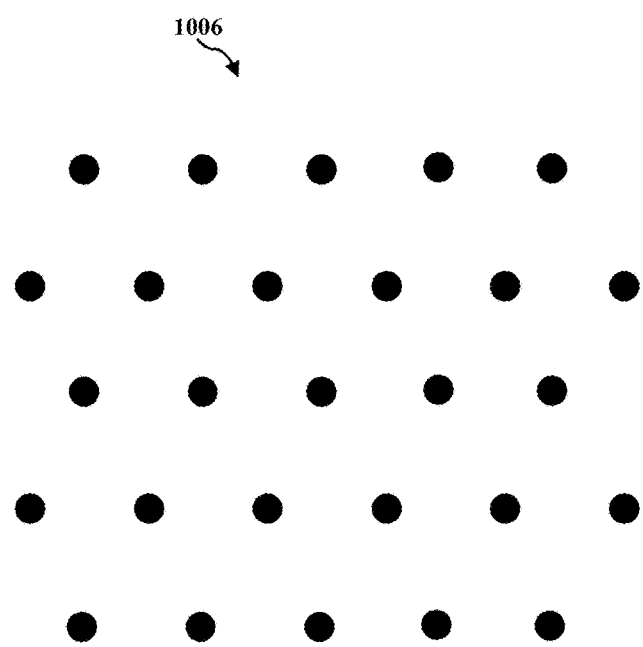

FIG. 10C illustrates still another exemplary placement pattern 1006 for the MOS standard fiducial cells. The placement pattern shown in FIG. 10C is a hexagonal pattern with no rotation. Dithering is applied to the x-positions and y-positions of the pattern shown in FIG. 10C so that the MOS standard fiducial cells are placed once dithering has been applied to the pattern. As shown in FIG. 10C, each MOS standard fiducial cell has six symmetrically positioned neighbors.

Figure 10D:
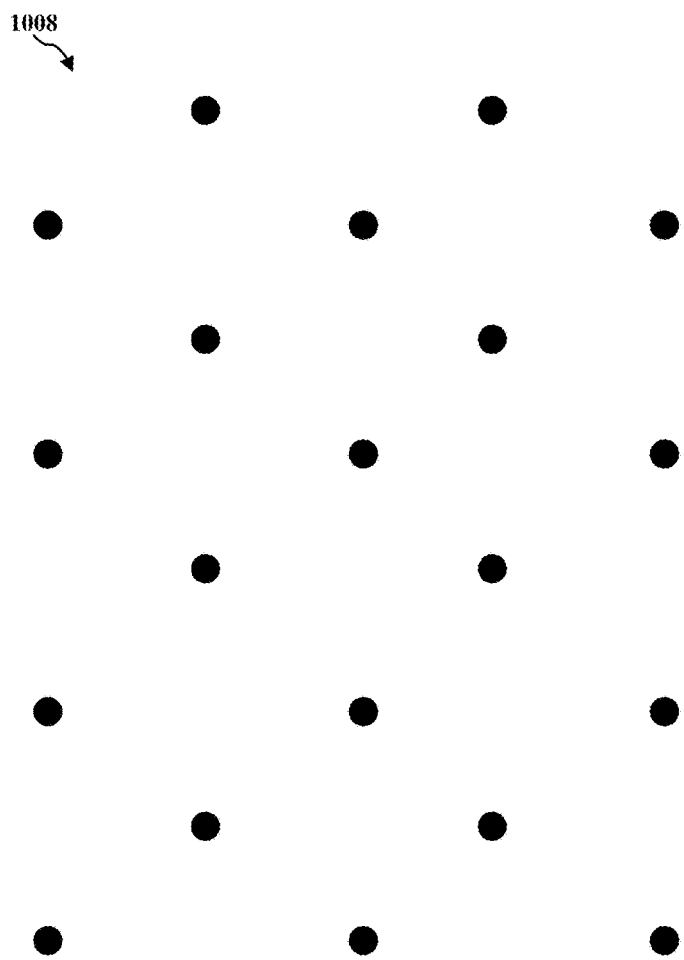

FIG. 10D illustrates still another exemplary placement pattern 1008 for the MOS standard fiducial cells. The placement pattern shown in FIG. 10C is a hexagonal pattern with a 90-degrees rotation. Dithering is applied to the x-positions and y-positions of the pattern shown in FIG. 10D so that the MOS standard fiducial cells are placed once dithering has been applied to the pattern. As shown in FIG. 10D, each MOS standard fiducial cell has six symmetrically positioned neighbors.

With regards to FIGS. 10A-10D, the CAD placement tool may implement a placement algorithm that includes dithering for any of the above placement patterns or for any other 2-D placement patterns. In particular any suitable shape may be utilized besides square and hexagonal shapes described above. For example, if the 50 um×50 um viewing aperture were rectangular rather than square (e.g., 60 um×40 um, 40 um×60 um), then any/all of these patterns may be scaled in the x-direction and the y-direction. Given the geometrical constraints, the scaling of the x-positioning and the y-positioning may be selected to minimize the area consumed by the MOS standard fiducial cells (ideally less than approx. 0.1%), have multiple MOS standard fiducial cells visible within any/every viewing aperture window, and be equally effective in the x-dimensions and the y-dimensions at providing multiple MOS standard fiducial cells visible with any/every viewing aperture window.

Figure 11:
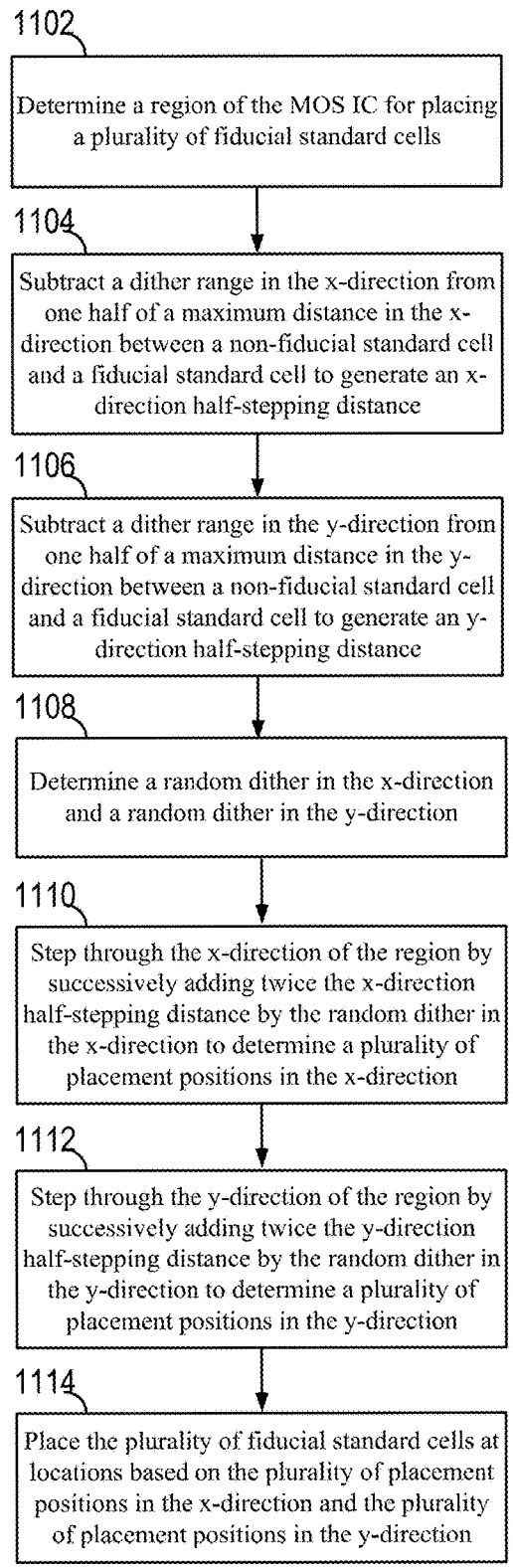
FIG. 11 illustrates a flowchart of an exemplary method of placing a plurality of fiducial standard cells in a MOS IC.

FIG. 11 illustrates a flowchart of an exemplary method of placing a plurality of fiducial standard cells in a region of a MOS IC. The method places the plurality of fiducial standard cells at a random offset (random dither) from a uniform global placement pattern to facilitate identification of the fiducial standard cells in the MOS IC and to allow alignment between the scanned images and the CAD layout image of the MOS IC. The method may be practiced by a placement algorithm of a CAD layout tool.

At block 1102, the method determines a region of the MOS IC for placing the plurality of fiducial standard cells. The region has an x-direction and a y-direction. The region may be the die region of a MOC IC in which non-fiducial standard cells will be placed and into which region fiducial standard cells are to be placed to create openings in the diffusion of the non-fiducial standard cells.

At block 1104, the method subtracts a dither range in the x-direction from one half of a maximum distance in the x-direction between a non-fiducial standard cell and one of the plurality of fiducial standard cells to generate an x-direction half-stepping distance. The x-direction half-stepping distance is used to step through the positions in the x-direction for placing the plurality of fiducial standard cells in the region of the MOS IC. For example, starting from a lower left reference point of the region of the MOS IC, the method may define an initial un-dithered position in the x-direction of a first fiducial standard cell at a location offset by x-direction half-stepping distance from the lower left reference point. The method may apply a random dither in the x-direction to the initial un-dithered position in the x-direction to determine the actual placement position of the first fiducial standard cell in the x-direction. The method may define additional un-dithered positions of additional fiducial standard cells by stepping by twice the x-direction half-stepping distance in the x-direction from the actual placement position of the first fiducial standard cell in the x-direction.

At block 1106, the method subtracts a dither range in the y-direction from one half of a maximum distance in the y-direction between a non-fiducial standard cell and one of the plurality of fiducial standard cells to generate a y-direction half-stepping distance. The y-direction half-stepping distance is used to step through the positions in the y-direction for placing the plurality of fiducial standard cells in the region of the MOS IC. For example, starting from a lower left reference point of the region of the MOS IC, the method may define an initial un-dithered position in the y-direction of a first fiducial standard cell at a location offset by y-direction half-stepping distance from the lower left reference point. The method may apply a random dither in the y-direction to the initial un-dithered position in the y-direction to determine the actual placement position of the first fiducial standard cell in the y-direction. The method may define additional un-dithered positions of additional fiducial standard cells by stepping by twice the y-direction half-stepping distance in the y-direction from the actual placement position of the first fiducial standard cell in the y-direction.

At block 1108, the method determines a random dither in the x-direction and a random dither in the y-direction. The random dither in the x-direction ranges from a minus half to a positive half times the dither range in the x-direction. Similarly, the random dither in the y-direction ranges from a minus half to a positive half times the dither range in the y-direction. The method may determine the random dither by determining two random seeds, one for the random dither in the x-direction and one for the random dither in the y-direction. The method may use one of the random seeds to determine a random dither in the x-direction between (−0.5*dither range in the x-direction) and (0.5*dither range in the x-direction). Similarly, the method may use the other random seed to determine a random dither in the y-direction between (−0.5*dither range in the y-direction) and (0.5*dither range in the y-direction).

At block 1110, the method steps through the x-direction of the region by successively adding twice the x-direction half-stepping distance by the random dither in the x-direction to determine a plurality of placement positions in the x-direction. For example, starting from a lower left reference point of the region of the MOS IC, the method may determine the actual x-position of the first fiducial standard cell in as discussed in block 1104 above. The method may determine the un-dithered x-position of the next fiducial standard cell by stepping by twice the x-direction half-stepping distance in the x-direction from the x-position of the first fiducial standard cell. The method may add the random dither in the x-direction to the un-dithered x-position of the next fiducial standard cell to determine the actual x-position of the next fiducial standard cell. The method may repeat the step until the end of the region in the x-direction is reached.

At block 1112, the method steps through the y-direction of the region by successively adding twice the y-direction half-stepping distance by the random dither in the y-direction to determine a plurality of placement positions in the y-direction. For example, starting from a lower left reference point of the region of the MOS IC, the method may determine the actual y-position of the first fiducial standard cell in as discussed in block 1106 above. The method may determine the un-dithered y-position of the next fiducial standard cell by stepping by twice the y-direction half-stepping distance in the y-direction from the y-position of the first fiducial standard cell. The method may add the random dither in the y-direction to the un-dithered y-position of the next fiducial standard cell to determine the actual y-position of the next fiducial standard cell. The method may repeat the step until the end of the region in the y-direction is reached.

At block 1114, the method places the plurality of fiducial standard cells at locations based on the plurality of placement positions in the x-direction and the plurality of placement positions in the y-direction. For example, the method may select the four fiducial standard cell types according to the desired utilization ratio and place the fiducial standard cells at the (x,y) positions determined in blocks 1108 and 1110.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A metal oxide semiconductor (MOS) integrated circuit (IC), comprising:
   a plurality of fiducial standard cells, wherein the plurality of fiducial standard cells include a plurality of cell sizes, the plurality of cell sizes are non-equally utilized among the plurality of fiducial standard cells, and the plurality of fiducial standard cells are placed to have a random offset from a uniform global placement pattern, wherein each cell size of the plurality of cell sizes of the plurality of fiducial standard cells has one or more openings in a diffusion layer of an active region to allow for reflections of a laser beam from a metal layer.

2. The MOS IC of claim 1, wherein each cell size of the plurality of cell sizes of the plurality of fiducial standard cells differ in at least one of an x-direction and a y-direction.

3. The MOS IC of claim 1, wherein the metal layer is not connected to the active region for each cell size of the plurality of cell sizes of the plurality of fiducial standard cells.

4. The MOS IC of claim 1, wherein each cell size the plurality of cell sizes differs in the openings in the diffusion layer of the active region.

5. The MOS IC of claim 1, wherein the plurality of fiducial standard cells are further placed to allow a reduced number of fiducial standard cells to be viewable within a viewing window aperture positioned at a plurality of positions on the MOS IC.

6. The MOS IC of claim 1, wherein each cell size of the plurality of cell sizes is non-equally utilized among the plurality of fiducial standard cells so that the fiducial standard cell having a largest cell size has a highest utilization.

7. The MOS IC of claim 1, wherein the plurality of fiducial standard cells are placed to have a random offset from a uniform global placement pattern by a placement of each of the plurality of fiducial standard cells to have a random dithering in distance from the uniform global placement pattern along at least one of an x-direction and a y-direction.

8. The MOS IC of claim 1, wherein the uniform global placement pattern comprises one of a non-rotated square pattern, a rotated square pattern, a non-rotated hexagonal pattern, and a rotated hexagonal pattern.

9. The MOS IC of claim 1, wherein the uniform global placement pattern is scaled to allow a reduced number of fiducial standard cells to be viewable within a viewing window aperture.

10. The MOS IC of claim 1, wherein the plurality of cell sizes of the plurality of fiducial standard cells comprises:
at least four power rails extending in a first direction across the fiducial standard cells, wherein each of the at least four power rails is coupled to a first voltage source or a second voltage source different than the first voltage source;
and wherein the active region includes one or more sets of active regions adjacent each of the at least four power rails, wherein each set of the one or more sets of active regions is collinear in the first direction, wherein at least one set of active regions includes at least two disjoint active regions, and wherein each set of the one or more sets of the active regions is disconnected from contacts and interconnects to the metal layer.

11. The MOS IC of claim 10, wherein the at least two disjoint active regions of the at least one set of the active regions are separated by less than 300 nm.

12. The MOS IC of claim 10, wherein each set of the one or more sets of active regions are aligned in a second direction orthogonal to the first direction.

13. The MOS IC of claim 10, wherein the at least two disjoint active regions of the at least one of the active regions comprises an active region on a first side of the fiducial standard cells and an active region on a second side of the fiducial standard cells.

14. The MOS IC of claim 10, wherein at least one of the active regions comprises one active region extending in the first direction across the fiducial standard cells.

15. The MOS IC of claim 10, wherein each cell size of the plurality of cell sizes of the plurality of fiducial standard cells further comprises a plurality of floating gate interconnects extending in a second direction across the fiducial standard cells, the second direction being orthogonal to the first direction.

16. The MOS IC of claim 10, wherein at least one of the active regions include at least three disjoint active regions.

17. The MOS IC of claim 16, wherein adjacent pairs of active regions of the at least three disjoint active regions are separated by less than 300 nm.

18. The MOS IC of claim 16, wherein the at least three disjoint active regions of the at least one of the active regions comprise an active region on a first side of the fiducial standard cells, an active region in a central portion of the fiducial standard cells, and an active region on a second side of the fiducial standard cells.

19. A method of placing a plurality of fiducial standard cells in a metal oxide semiconductor (MOS) integrated circuit (IC), comprising:
determining a region of the MOS IC for placing the plurality of fiducial standard cells, wherein the region has an x-direction and a y-direction;
subtracting a dither range in the x-direction from one half of a maximum distance in the x-direction between a non-fiducial standard cell and one of the plurality of fiducial standard cells to generate an x-direction half-stepping distance;
subtracting a dither range in the y-direction from one half of a maximum distance in the y-direction between a non-fiducial standard cell and one of the plurality of fiducial standard cells to generate a y-direction half-stepping distance;
determining a random dither in the x-direction, wherein the random dither in the x-direction ranges from a minus half to a positive half times the dither range in the x-direction;
determining a random dither in the y-direction, wherein the random dither in the y-direction ranges from a minus half to a positive half times the dither range in the y-direction;
stepping through the x-direction of the region by successively adding twice the x-direction half-stepping distance by the random dither in the x-direction to determine a plurality of placement positions in the x-direction;
stepping through the y-direction of the region by successively adding twice the y-direction half-stepping distance by the random dither in the y-direction to determine a plurality of placement positions in the y-direction; and
placing the plurality of fiducial standard cells at locations based on the plurality of placement positions in the x-direction and the plurality of placement positions in the y-direction.

20. The MOS IC of claim 1, wherein a total area of the plurality of fiducial standard cells is less than 0.1% of an area of the MOS IC.

* * * * *